US011980110B2

United States Patent
Philip et al.

(10) Patent No.: US 11,980,110 B2
(45) Date of Patent: May 7, 2024

(54) INSULATED PHASE CHANGE MEMORY USING POROUS DIELECTRICS

(71) Applicant: International Business Machines Corporation, Armonk, NY (US)

(72) Inventors: Timothy Mathew Philip, Albany, NY (US); Anirban Chandra, Troy, NY (US); Kevin W. Brew, Niskayuna, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 17/479,321

(22) Filed: Sep. 20, 2021

(65) Prior Publication Data

US 2023/0093026 A1  Mar. 23, 2023

(51) Int. Cl.
   *H10N 70/20*  (2023.01)
   *H10B 63/00*  (2023.01)
   *H10N 70/00*  (2023.01)

(52) U.S. Cl.
   CPC ........... *H10N 70/231* (2023.02); *H10B 63/00* (2023.02); *H10N 70/8413* (2023.02)

(58) Field of Classification Search
   CPC ....... H10N 70/231–235; H10N 70/826; H10B 63/00; H01L 29/0649
   See application file for complete search history.

(56) References Cited

U.S. PATENT DOCUMENTS 7,323,708 B2 *  1/2008  Lee .................. H10N 70/828
                                                     257/296
7,473,576 B2 *  1/2009  Lung .................. H10N 70/20
                                                     438/102
7,879,643 B2   2/2011  Lung
7,910,907 B2   3/2011  Lung
8,110,430 B2   2/2012  Lung
10,147,876 B1 * 12/2018 Huang ................ H10N 70/235
10,832,941 B2  11/2020 Seo et al.
(Continued)

FOREIGN PATENT DOCUMENTS

WO       2004034482 A2    4/2004

OTHER PUBLICATIONS

Scott W. Fong et al., "Dual-layer dielectric stack for thermally isolated low-energy phase-change memory," IEEE Transactions on Electron Devices, vol. 64, No. 11, 2017, pp. 4496-4502.
(Continued)

*Primary Examiner* — Walter H Swanson
*Assistant Examiner* — Jacob T Nelson
(74) *Attorney, Agent, or Firm* — Patterson + Sheridan, LLP

(57) ABSTRACT

Insulated phase change memory devices are provided that include a first electrode; a second electrode; a phase change material disposed in an electrical path between the first electrode and the second electrode; and a porous dielectric configured to concentrate heat produced by a reset current carried through the phase change material between the first electrode and the second electrode to mitigate an amount of heat that escapes from the phase change material. The porous dielectric may be an inherently porous dielectric material or a dielectric material in which porous structures are induced during fabrication. Methods of fabrication of such devices are also provided.

20 Claims, 38 Drawing Sheets

(56) References Cited

U.S. PATENT DOCUMENTS

| | | |
|---|---|---|
| 2006/0175596 A1 | 8/2006 | Happ et al. |
| 2007/0096162 A1 | 5/2007 | Happ et al. |
| 2009/0161406 A1* | 6/2009 | Chuang .................. H10B 63/20 |
| | | 438/102 |
| 2013/0001499 A1 | 1/2013 | Breitwisch et al. |
| 2013/0175493 A1 | 7/2013 | Song et al. |
| 2015/0207068 A1 | 7/2015 | Cho et al. |
| 2018/0205017 A1* | 7/2018 | Bruce .................... H10B 63/84 |
| 2020/0136036 A1* | 4/2020 | Wu ....................... H10N 70/068 |
| 2021/0257547 A1* | 8/2021 | Shen .................. H10N 70/8828 |

OTHER PUBLICATIONS

Christopher M. Neumann et al., "Engineering thermal and electrical interface properties of phase change memory with monolayer MoS2," Applied Physics Letters, vol. 114, No. 8, 2019, 082103, 8 pp.

Ha T-J et al., "Application of ordered mesoporous SiO2 film for low power consumption in phase-change memory," Microporous and Mesoporous Materials, vol. 163, dated Jul. 26, 2012, pp. 321-325, XP028936614 [Abstract Only].

PCT, Invitation to Pay Additional Fees and, Where Applicable, Protest Fee for Application PCT/EP2022/073562 dated Jan. 5, 2023.

PCT, Notification of Transmittal of The International Search Report and THe Written Opinion of The International Searching Authority, or The Declaration for Application PCT/EP2022/073562 Dated Feb. 27, 2023.

* cited by examiner

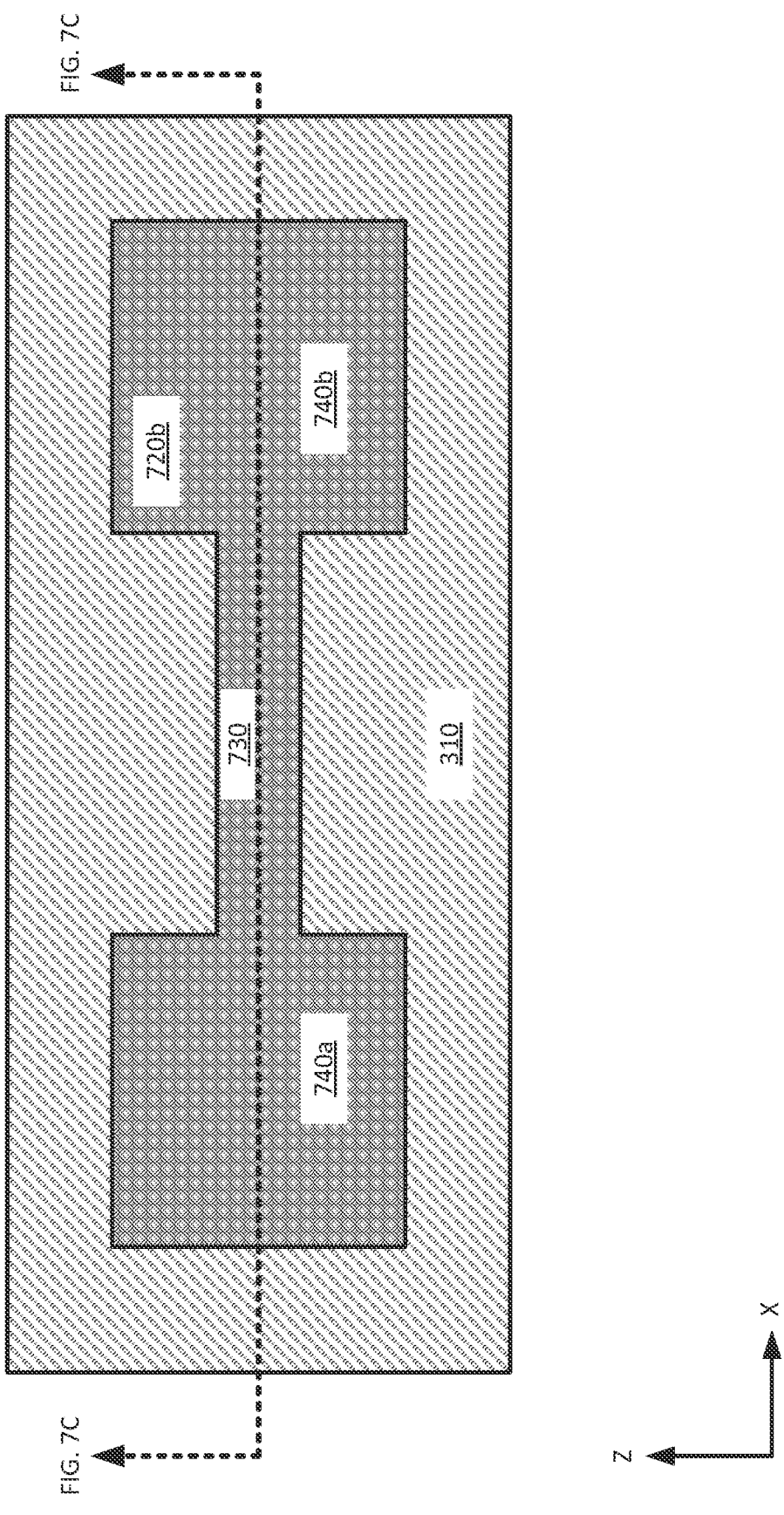

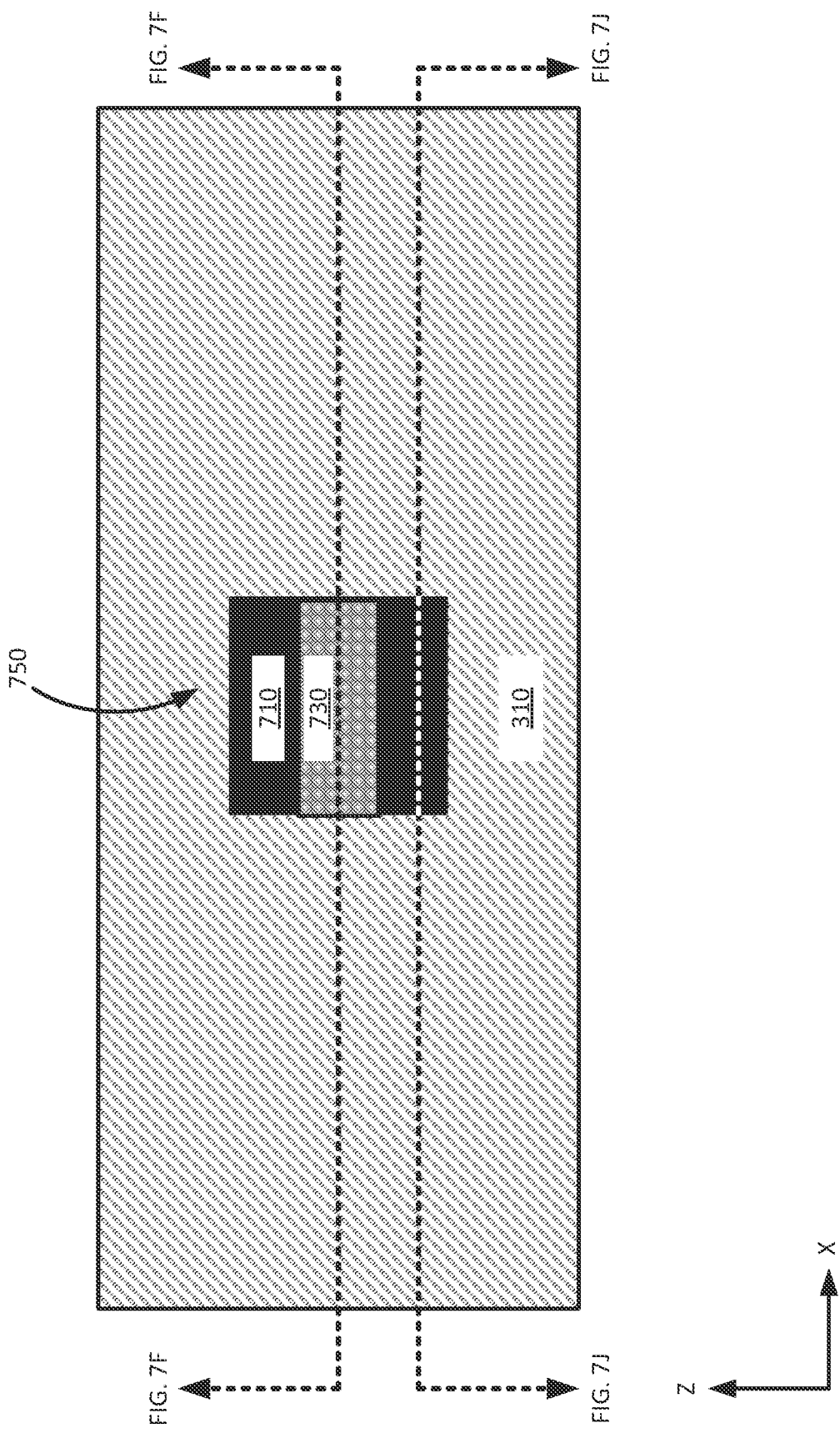

FIG. 8G

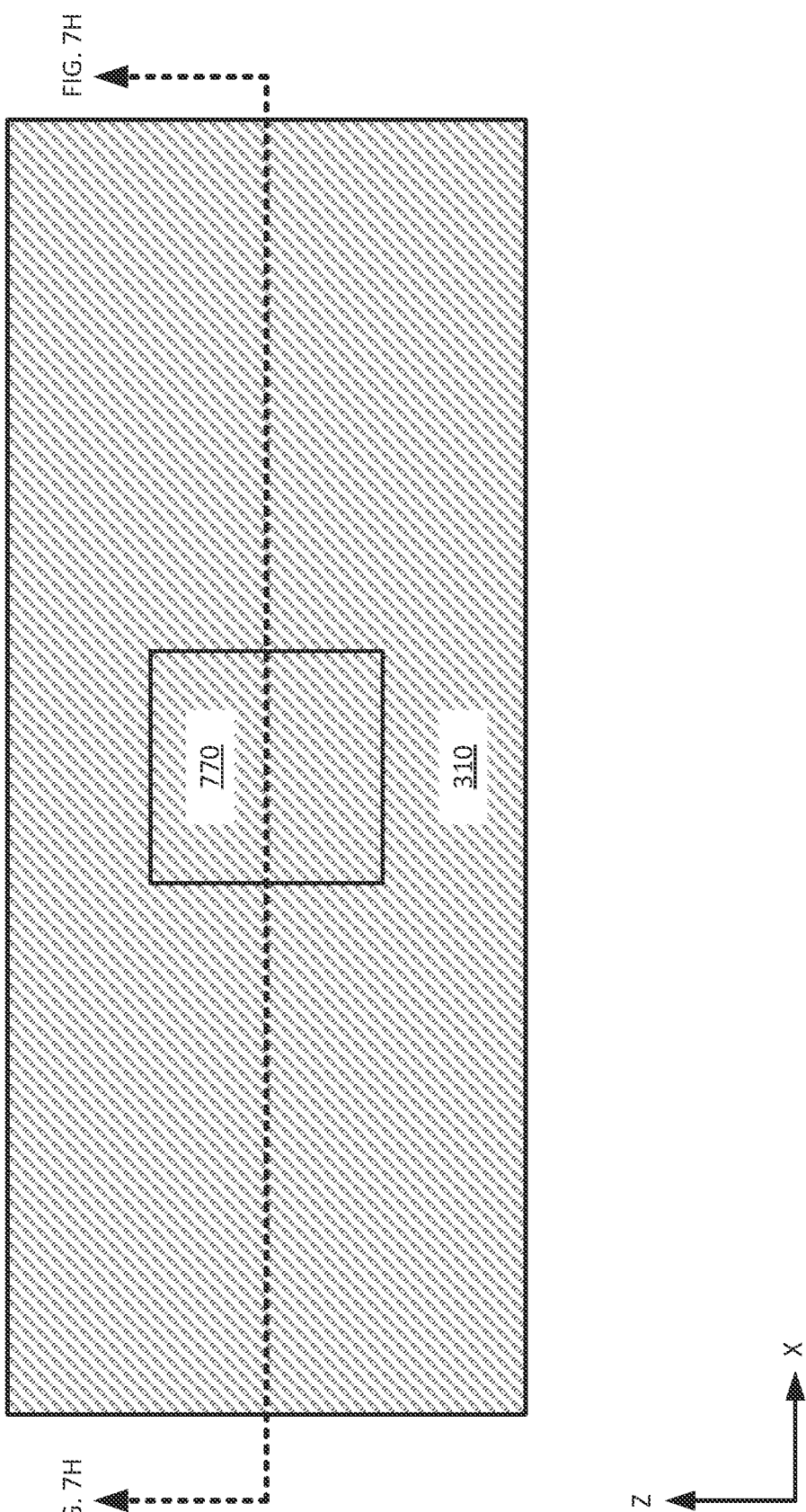

INSULATED PHASE CHANGE MEMORY USING POROUS DIELECTRICS

BACKGROUND

The present invention relates to phase change memory (PCM) devices, and more specifically, the design and fabrication thereof. PCM devices are a non-volatile memory technology that use variable resistances to represent different logic states using different physical states in the materials used therein. By altering the physical state of a phase change material included in the PCM device, an operator can store are recall various logical values. Once set to a physical state associated with a logical value, the logical value stored by the PCM device can be read out by applying a read current across the electrodes to read the resistive value. However, to change the logical value stored in the PCM device, a reset current (which is higher voltage/amperage, applied for a longer duration, or combinations thereof relative to a read current). In various embodiments, the reset current is applied for different lengths of time or with different power curves to allow the phase change material in the PCM to heat or cool at different rates to set the phase change material to a different physical state (and thereby different logical value).

For example, two electrodes can pass a reset electrical current through a material to change the phase of that material (e.g., from solid to liquid) by heating that material. After heating that material, the material is allowed to cool to various different physical states (e.g., an amorphous solid state or a crystalline solid state) based on a rate of thermal quenching. In various embodiments, the extent to which the phase change material is set to various potential physical states can vary to express a range of resistances that are associated with different logical values to store in memory. For example, when the PCM device includes 0-X percent of the phase change material in an amorphous state (and the remainder in a crystalline state), the PCM device may exhibit a resistance range of $R_0$-$R_X$, which is associated with logical TRUE/1 when the resistance measured. In contrast, when the PCM device includes X-100 percent of the phase change material in an amorphous state (and the remainder in a crystalline state), the PCM device may exhibit a resistance range of $R_X$-$R_{100}$, which is associated with logical FALSE/0 when the resistance is measure.

SUMMARY

According to one embodiment of the present invention, a Phase Change Memory (PCM) device is provided that comprises: a first electrode; a second electrode; a porous dielectric extending in a first direction from the first electrode; a heater electrode disposed within the porous dielectric and electrically connected to the first electrode; and a phase change material, disposed between the porous dielectric and the second electrode and electrically connected to the heater electrode.

In some embodiments, the porous dielectric is made of an inherently porous dielectric material.

In some embodiments, the porous dielectric is made of an induced porous dielectric material in which a plurality of porous structures are defined.

In some embodiments, the device further comprises a conductive projection liner disposed between the porous dielectric and the phase change material, wherein the conductive projection liner seals voids defined in the induced porous dielectric material to define the plurality of porous structures.

In some embodiments, the device further comprises an additional layer of dielectric material applied over voids defined in the induced porous dielectric material to define the plurality of porous structures.

In some embodiments, the plurality of porous structures define concentric channels centered on the heater electrode.

In some embodiments, the phase change material is configured to exhibit a first resistance when in a first solid state and exhibit a second resistance different from the first resistance when in a second solid state different from the first solid state.

According to one embodiment of the present invention, a Phase Change Memory (PCM) device is provided that comprises: a first electrode; a second electrode; a phase change material comprising: a first connected region electrically connected to the first electrode; a second connected region electrically connected to the second electrode; a bridging region electrically connecting the first connected region to the second connected region, wherein the bridging region has a higher surface area to volume ratio than either the first connected region or the second connected region; and a porous dielectric disposed around the bridging region.

In some embodiments, the porous dielectric is made of an inherently porous dielectric material.

In some embodiments, the porous dielectric is made of an induced porous dielectric material, wherein a void is defined in the porous dielectric around the bridging region and a dielectric cap is formed to seal the void and define a porous structure.

In some embodiments, the device further comprises a conformal encapsulation material disposed around the phase change material.

In some embodiments, the device further comprises a second porous dielectric defined around a second region of the phase change material.

In some embodiments, the phase change material is configured to exhibit a first resistance when in a first solid state and exhibit a second resistance different from the first resistance when in a second solid state different from the first solid state.

According to one embodiment of the present invention, a Phase Change Memory (PCM) device is provided that comprises: a first electrode; a second electrode; a phase change material disposed in an electrical path between the first electrode and the second electrode; and a porous dielectric configured to concentrate heat produced by a reset current carried through the phase change material between the first electrode and the second electrode to mitigate an amount of heat that escapes from the phase change material.

In some embodiments, the porous dielectric is made of an inherently porous dielectric material.

In some embodiments, the porous dielectric is made of an induced porous dielectric material in which a plurality of porous structures are defined.

In some embodiments, the device further comprises a heater electrode extending from the first electrode and disposed in the porous dielectric.

In some embodiments, the phase change material includes: a first connected region electrically connected to the first electrode; a second connected region electrically connected to the second electrode; and a bridging region electrically connecting the first connected region to the second connected region, wherein the bridging region has a higher surface area to volume ratio than either the first connected region or the second connected region.

In some embodiments, the porous dielectric is defined around the bridging region in a gap defined in a surrounding dielectric.

In some embodiments, the porous dielectric is an induced porous dielectric in which a gap is defined around the bridging region to contain an atmosphere of a predefined composition and a predefined pressure.

According to one embodiment of the present invention, method for fabricating a Phase Change Memory (PCM) device is provided that comprises: depositing a porous dielectric on a first electrode; patterning the porous dielectric to define a hole; forming a heater electrode in the hole; depositing a phase change material on the heater electrode and the porous dielectric; and depositing a second electrode on the phase change material.

In some embodiments, the porous dielectric is made of an inherently porous dielectric material.

In some embodiments, the porous dielectric is made of an induced porous dielectric material, the method further comprising, before depositing the phase change material, inducing a plurality of porous structures in the induced porous dielectric material.

In some embodiments, inducing the plurality of porous structures in the induced porous dielectric material further comprises: etching the porous dielectric to define a plurality of voids in the porous dielectric; and capping the plurality of voids to define the plurality of porous structures.

In some embodiments, capping the plurality of voids to define the plurality of porous structures further comprises: applying a projection liner over the porous dielectric that seals the plurality of voids.

In some embodiments, capping the plurality of voids to define the plurality of porous structures further comprises: applying an additional layer of dielectric over the porous dielectric that seals the plurality of voids; and planarizing the additional layer of dielectric to expose the heater electrode from the additional layer of dielectric.

In some embodiments, the phase change material is configured to exhibit a first resistance when in a first solid state and exhibit a second resistance different from the first resistance when in a second solid state different from the first solid state.

According to one embodiment of the present invention, a method for fabrication a Phase Change Memory (PCM) device is provided that comprises: depositing, in a phase change memory (PCM) device cell, a phase change material over a first layer of an encapsulation material, a first electrode, and a second electrode; depositing a second layer of the encapsulation material over the phase change material; etching a bridge pattern in the phase change material and the second layer such that the phase change material includes: a first connected region electrically connected to the first electrode; a second connected region electrically connected to the second electrode; and a bridging region electrically connecting the first connected region to the second connected region, wherein the bridging region has a higher surface area to volume ratio than either the first connected region or the second connected region; depositing a conformal layer of the encapsulation material over the bridge pattern; filling the PCM device cell with a dielectric material; and defining a gap in the dielectric material around the bridging region.

In some embodiments, the method further comprises filling the gap with an inherently porous dielectric.

In some embodiments, the method further comprises capping the gap with a dielectric to define a porous structure around the bridging region.

In some embodiments, the porous structure maintains an atmosphere experienced by the PCM device cell during fabrication including a known composition and pressure.

In some embodiments, the method further comprises defining at least a second gap in the dielectric material at a second region around the phase change material.

In some embodiments, the gap is defined from a first surface in the dielectric material to a base dielectric layer on which the first electrode and the second electrode are anchored.

In some embodiments, the phase change material is configured to exhibit a first resistance when in a first solid state and exhibit a second resistance different from the first resistance when in a second solid state different from the first solid state.

BRIEF DESCRIPTION OF THE SEVERAL VIEWS OF THE DRAWINGS

FIGS. 7A-7J illustrate example design layouts of a bridge cell PCM device in cross-sectional planes, according to embodiments of the present disclosure.

FIGS. 8A-8H illustrate example design layouts of a bridge cell PCM device in a top-down view perpendicular to the cross-sectional planes shown in FIGS. 7A-7J, according to embodiments of the present disclosure.

DETAILED DESCRIPTION

Because Phase Change Memory (PCM) devices rely on thermal heating to set and reset the stored logical values, heat that escapes from the PCM device to the surroundings is wasted in affecting a phase change in the PCM device. This wasted heat results in higher power consumption for the PCM device, potential unintended heating of surrounding devices (e.g., heating of a second device when intending to heat a first device), increased load on a cooling system, and the like. The present disclosure provides for improvements to PCM devices to thermally isolate the devices, which can result in lower reset currents (e.g., lower power consumption), more reliable operation of surrounding devices, higher density deployments of PCM devices, lower cooling requirements, and other benefits that will be apparent to one of ordinary skill in the art upon reading the present disclosure.

These improved PCM devices include at least two electrodes and a phase change material located in an electrical path between the electrodes. The phase change material is selected to exhibit a first resistance when in a first solid state and exhibit a second resistance (different from the first resistance) when in a second solid state different from the first solid state. Accordingly, an operator can apply a read current across the two electrodes to read out a logical value associated with the first or the second resistance. To reduce the amount of waste heat generated when an operator applies a reset current across the two electrodes to reset the logical value held by the improved PCM device, a porous dielectric is provided to concentrate heat produced by the reset current to remain in the phase change material. Various configurations and layouts of PCM devices can incorporate the teachings of the present disclosure, several examples of which (and methods of fabrication thereof) are provided in relation to FIGS. 1-9D.

With reference now to FIGS. 1-5C, a method of fabrication and example design layouts therefor are presented for a "mushroom" cell PCM device that uses porous dielectrics to concentrate heat from the reset current to the phase change material.

Figure 1:
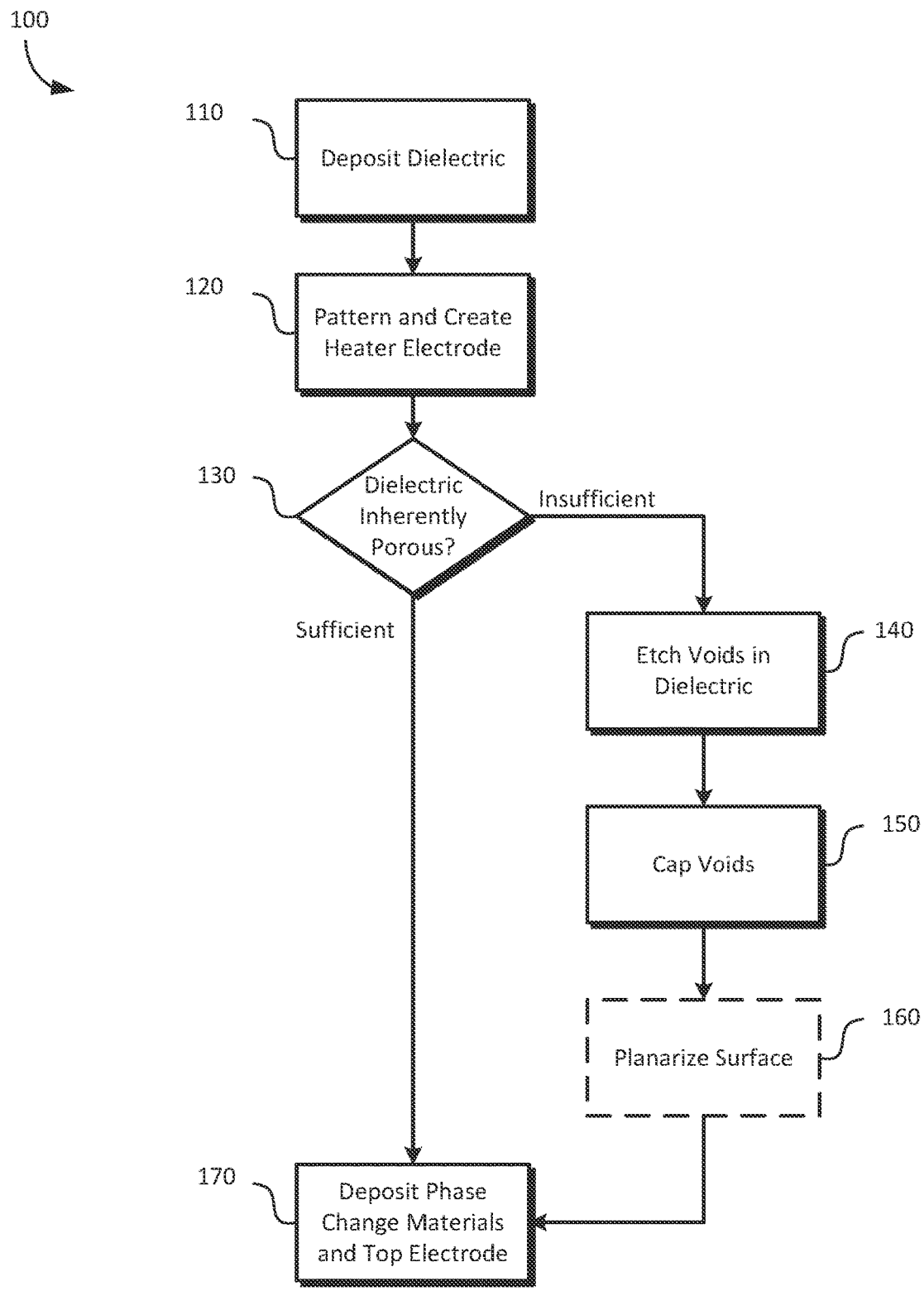
FIG. 1 is a flowchart of a method of fabrication for a mushroom cell PCM device that uses porous insulators to concentrate heat from the reset current to the phase change material, according to embodiments of the present disclosure.

FIG. 1 is a flowchart of a method 100 for fabricating a mushroom cell PCM device, according to embodiments of the present disclosure. Method 100 may be understood with reference to FIGS. 2A-5C, which illustrate example PCM devices during fabrication, according to embodiments of the present disclosure.

Method 100 begins at block 110, where a fabricator deposits a dielectric on a first electrode 210a (generally or collectively, electrode 210). The electrodes 210 can include various electrically conductive materials including, Tungsten (W), Titanium Nitride (TiN), Tantalum Nitride (TaN), or the like.

Figure 2A:
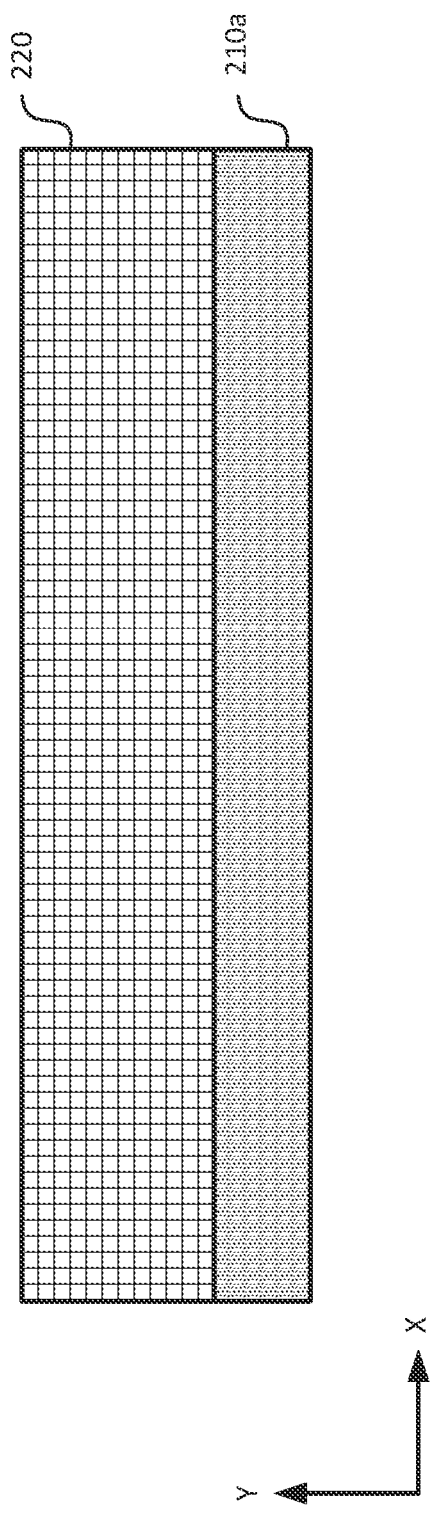
FIGS. 2A-2C illustrate example design layouts of a mushroom cell PCM device using an inherently porous dielectric material as a thermal insulator, according to embodiments of the present disclosure.
Figure 2B:
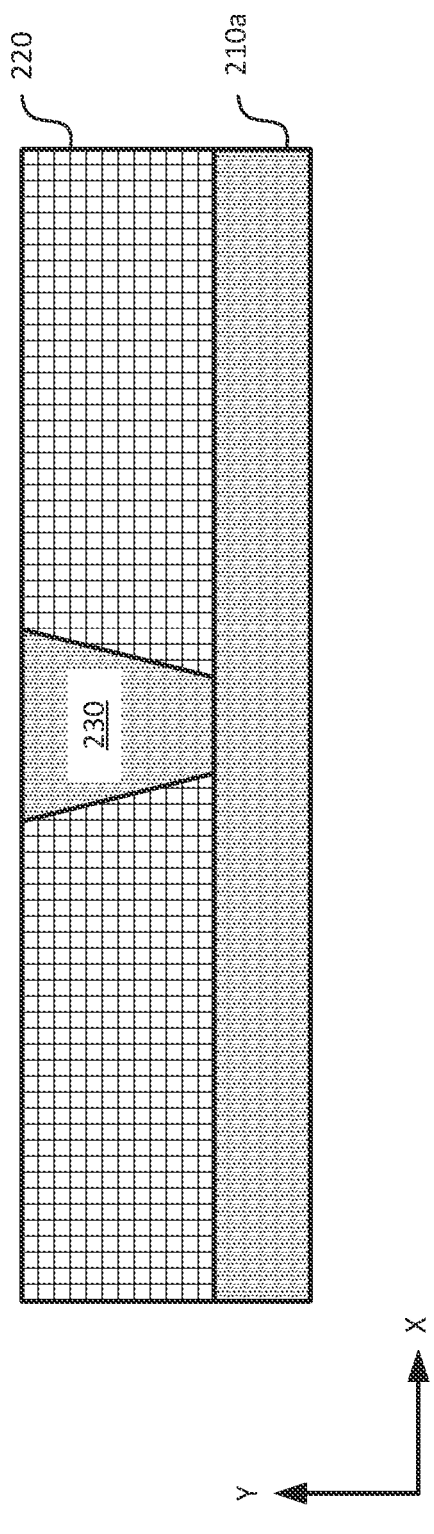

In various embodiments, such as in FIG. 2A, the dielectric 220 is an inherently porous dielectric, such as, for example, SiCOH (e.g., a carbon doped oxide of Silicon). In other embodiments, such as in FIG. 3A, the dielectric 310 is an induced porous dielectric material, such as, for example, SiN (Silicon Nitride), $SiO_2$ (silicon dioxide), SiCOH (that the fabricator desires to induce additional porous structures into), etc. The porous nature of the dielectric, whether inherent to the dielectric material or induced to include more or larger porous structures, enable the dielectric to capture air or another ambient gas present during the fabrication process (at the pressure present during fabrication, including vacuum). These porous structures impede the transfer of heat, and thus concentrate the thermal energy in the phase change material of the finalized PCM device.

Figure 3A:
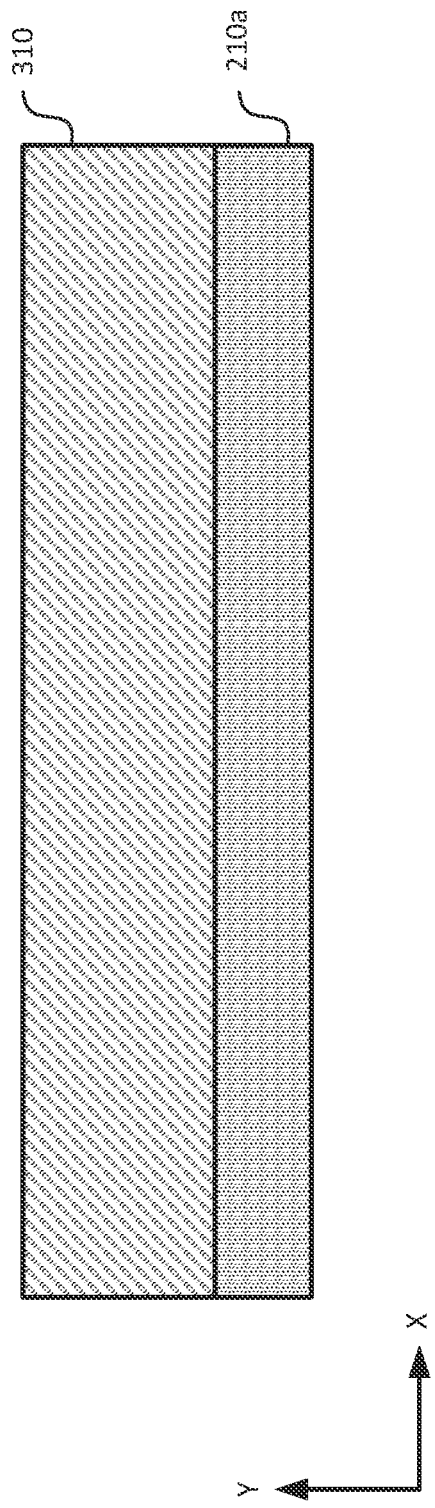
FIGS. 3A-3F illustrate example design layouts of a mushroom cell PCM device using an induced porous dielectric material as a thermal insulator, according to embodiments of the present disclosure.
Figure 3B:
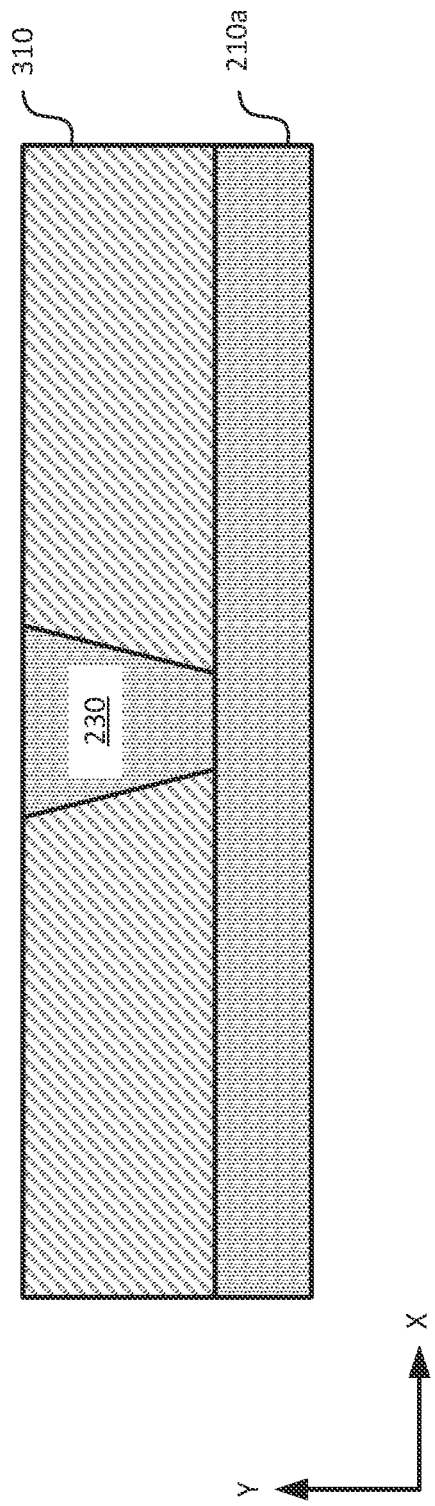
Figure 4A:
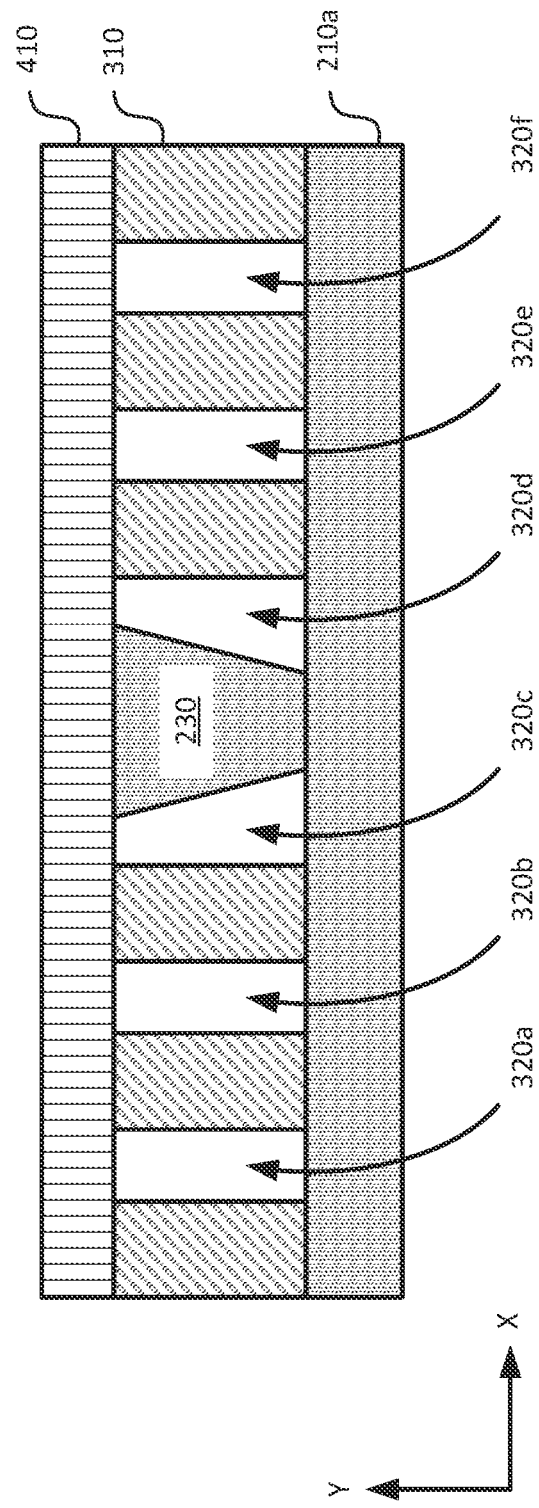
FIGS. 4A-4B illustrate example design layouts of a mushroom cell PCM device using a projection liner to define porous structures in an induced porous dielectric material, according to embodiments of the present disclosure.
Figure 4B:
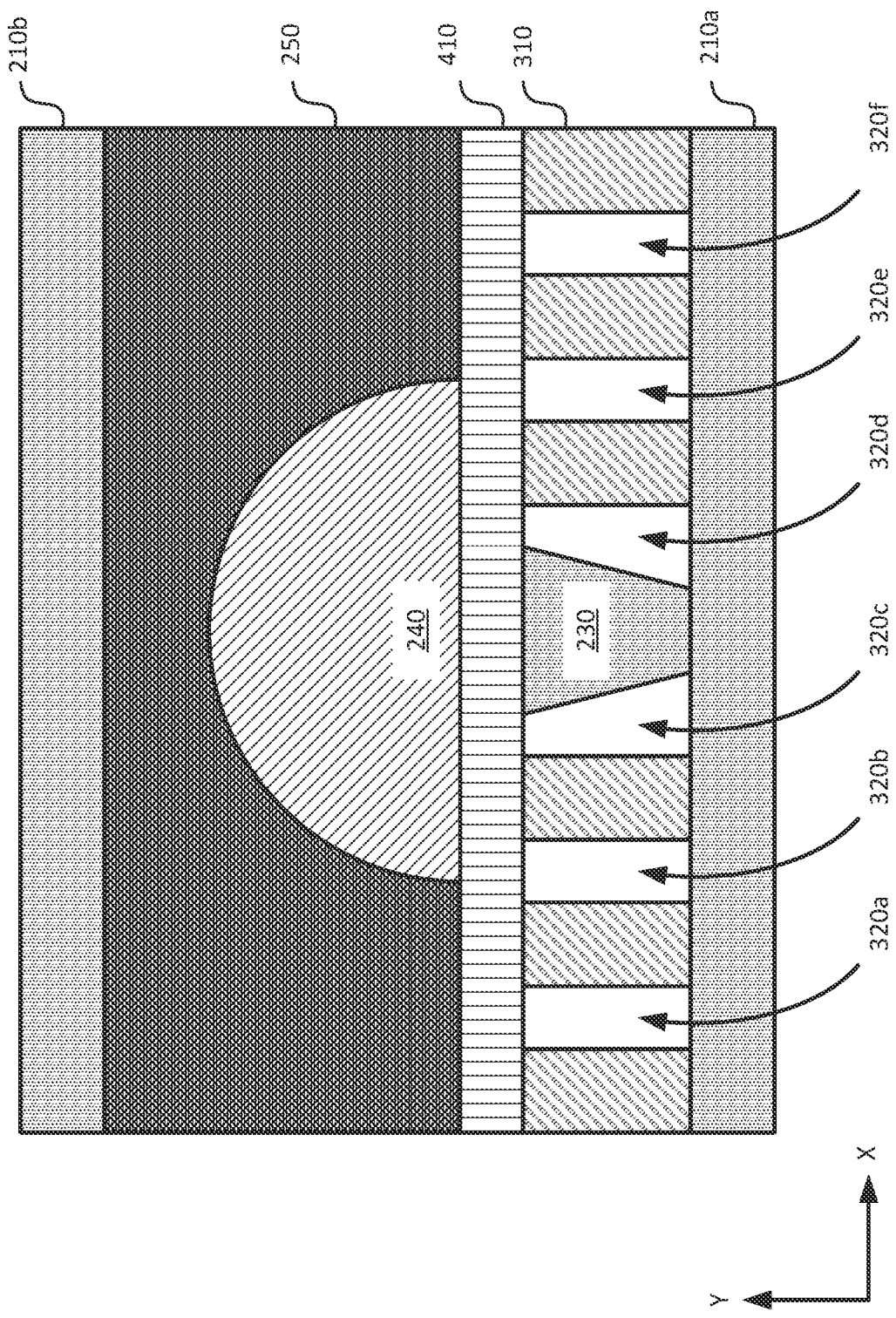

At block 120 the fabricator patterns the dielectric and creates a heater electrode 230. As shown in FIGS. 3B and 4B, the heater electrode 230 is in electrical contact with the first electrode 210a. Depending on the size and shape of a hole defined in the dielectric, the heater electrode 230 may take various sizes and shapes, but in shown in the present figures as being generally conic, with a larger face projecting outward from the first electrode 210a and level with a surface of the dielectric material. In various embodiments, the heater electrode 230 can be made of the same or a different material as the other electrodes 210.

At block 130 the fabricator determines whether the inherent porosity of the dielectric is sufficient for thermal isolation. When the inherent porosity is sufficient, method 100 proceeds to block 170. When the inherent porosity is insufficient, method 100 proceeds to block 140.

Figure 3C:
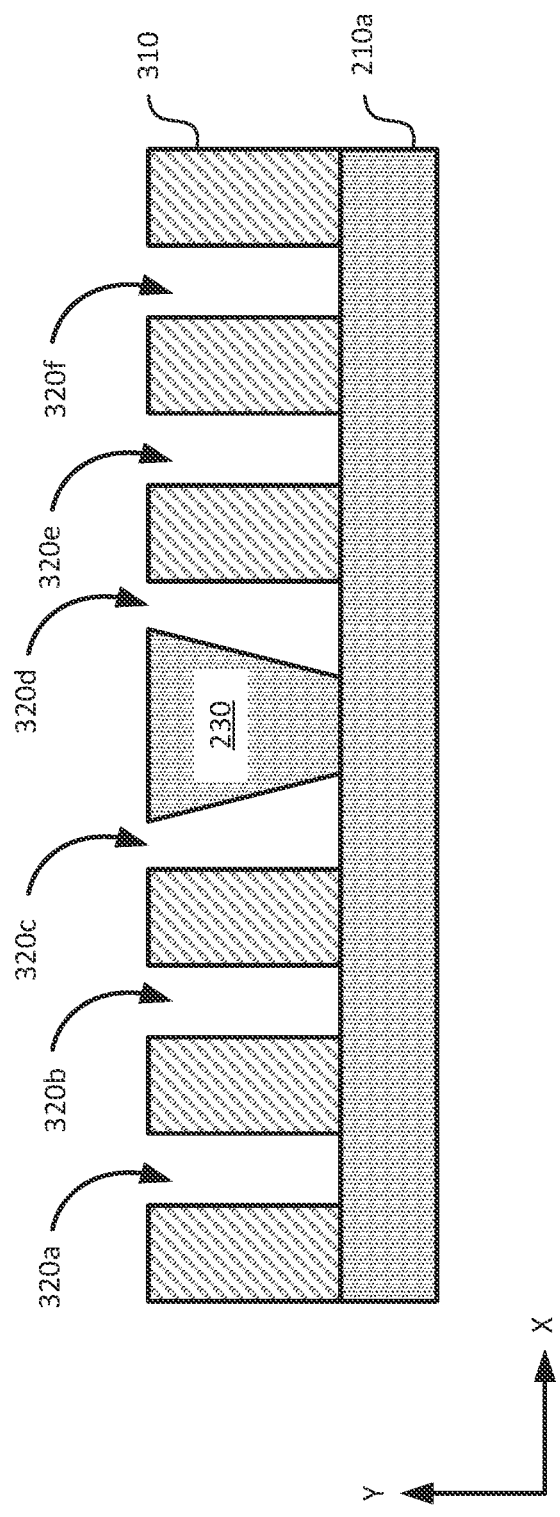
Figure 3D:
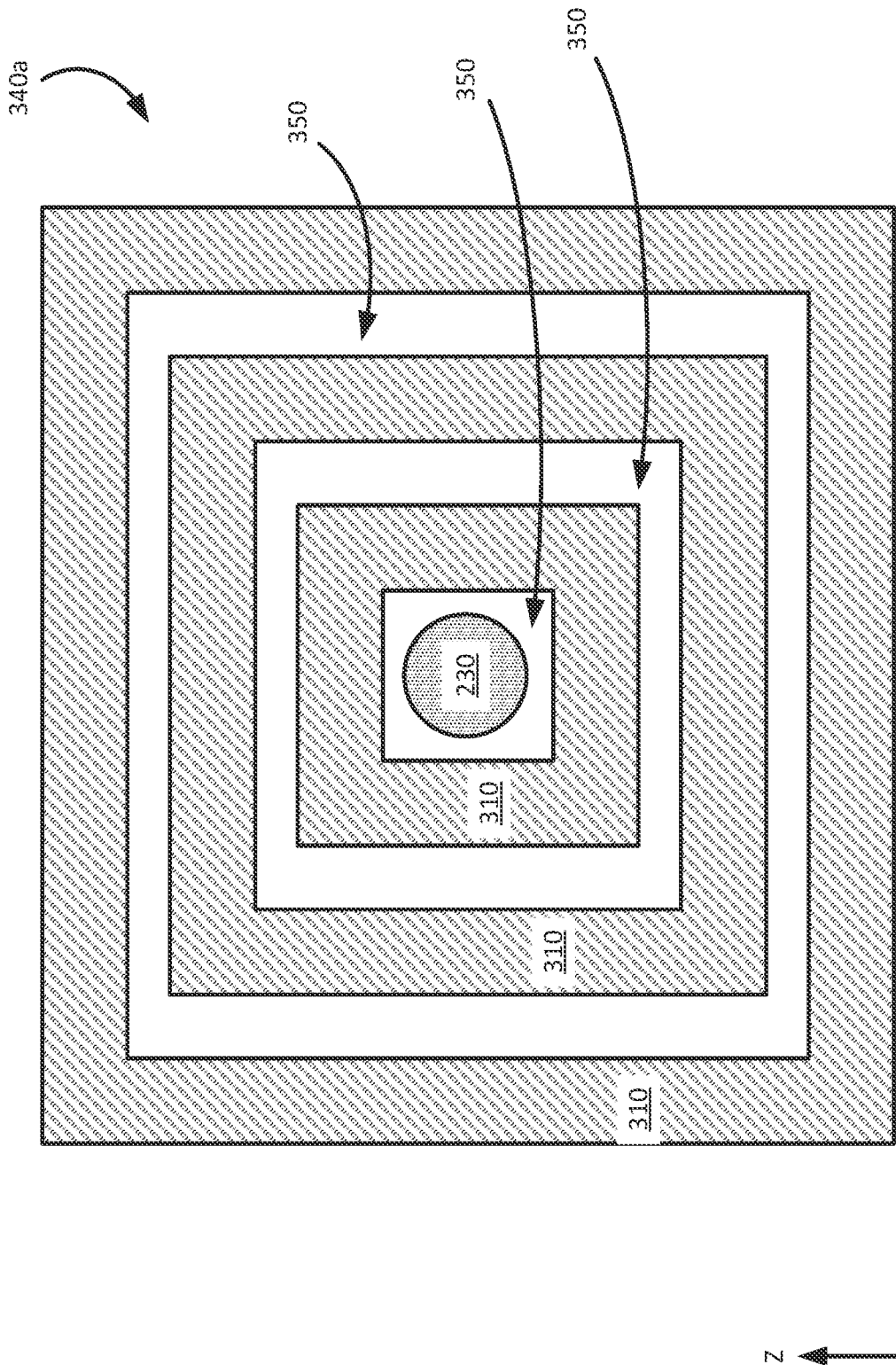
Figure 3E:
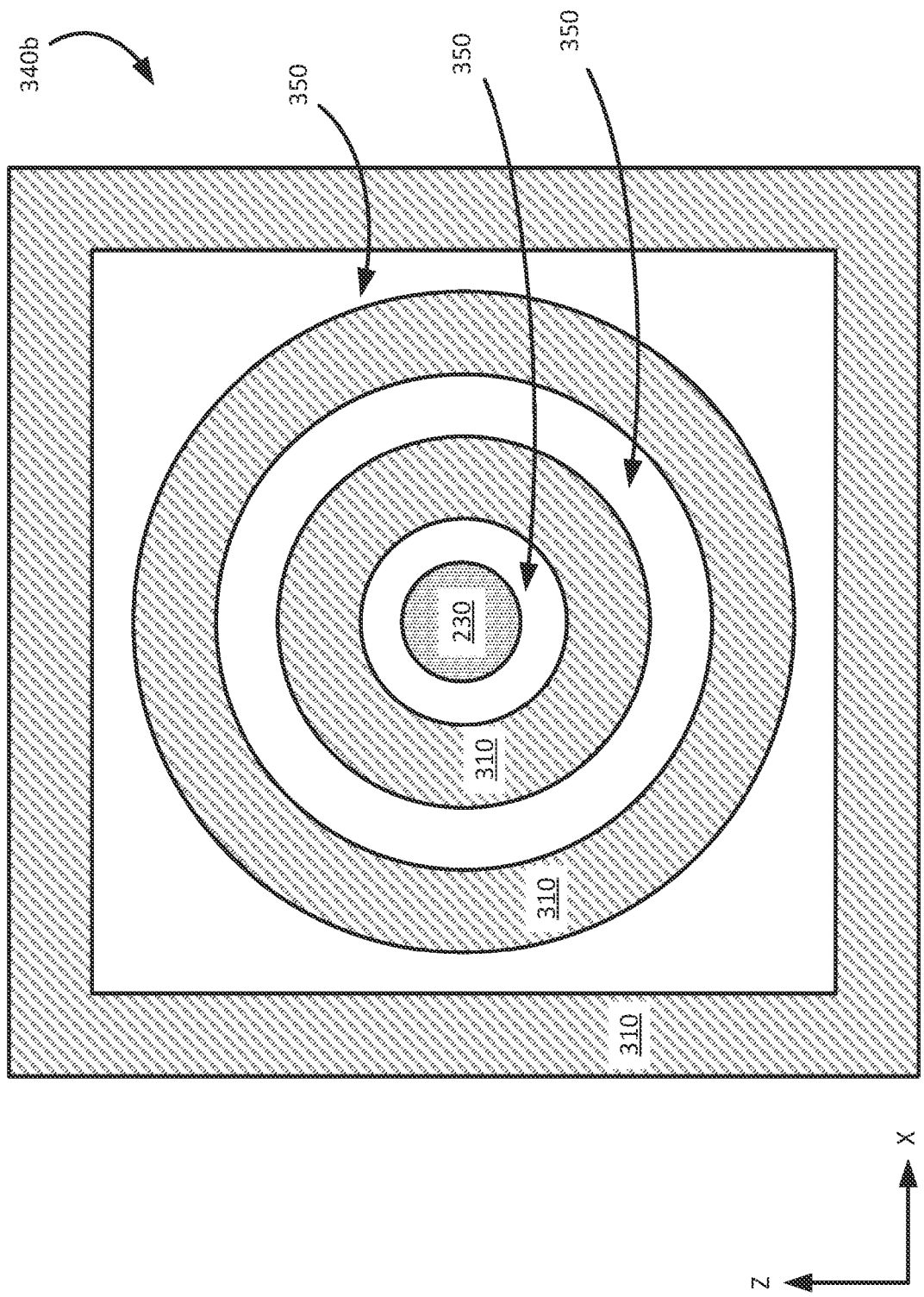
Figure 3F:
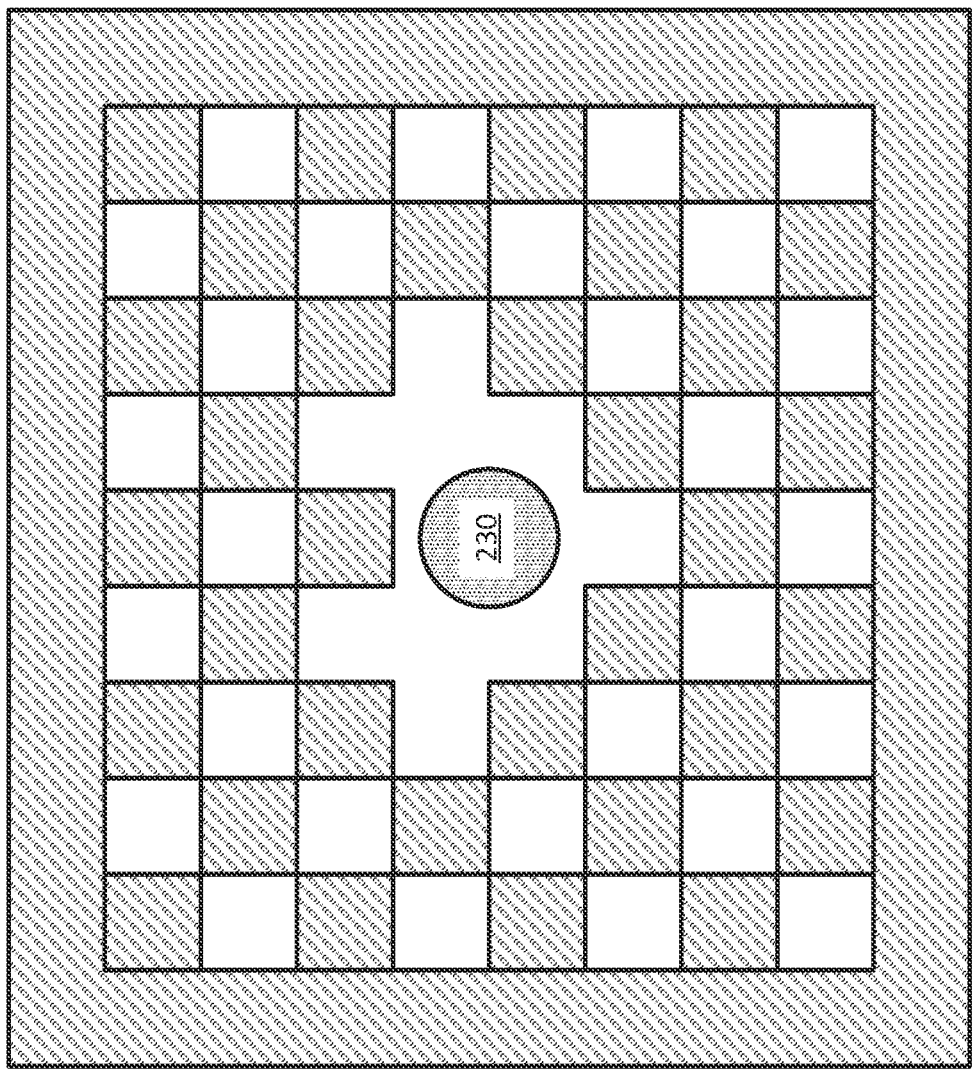

At block 140 the fabricator etches a plurality of voids 320a-f (generally or collectively, voids 320) in the dielectric to as part of defining porous structures in the dielectric, as is shown in FIG. 3C. In various embodiments, the voids 320 are formed in various patterns 340a-c (generally or collectively, patterns 340), such as is shown in FIGS. 3D-3F to define pockets in which an atmosphere at a known composition and pressure is trapped during fabrication. In various embodiments, the atmosphere may include air, a known gas composition (e.g., Nitrogen, Helium), or vacuum at a predefined pressure.

As shown in FIGS. 3D-3F, the fabricator can form the voids 320 to define various different patterns 340 to help contain heat in the phase change material close to the heater electrode 230. For example, the voids 320 may be used to form concentric channels 350 centered around the heater electrode 230 in square/rectangular, circular, ovoid, or other shapes (and combinations thereof) such as shown in FIGS. 3D and 3E. In other examples, such as is shown in FIG. 3F, the pattern 340 can include various pockets (e.g., arranged in a checkerboard) without using channels 350 centered around the heater electrode 230. Although shown with regular patterns, in various embodiments a fabricator may use irregular patterns to direct and concentrate heat in various different corresponding regions according to the desired memory retention characteristics in the associated PCM device.

At block 150 the fabricator caps the voids 320 to define porous structures in the dielectric. In some embodiments, such as in FIGS. 4A-4B, the fabricator uses a projection liner 410 to seal the voids 320 and trap the atmosphere therein. In various embodiments, the projection liner 410 is thin-film material, such as Tantalum Nitride (TaN) or Aluminum Nitride (AlN), that separates the voids 320 from outside atmosphere and allows additional layers to be deposited thereon. In other embodiments, such as in FIGS. 5A-5C, the fabricator uses an additional layer 510 of a dielectric material (which may be the same or a different dielectric material as that dielectric material deposited in block 110).

In various embodiments, the distance (e.g., in the X-direction) due to the voids 320 between remaining elements of the dielectric 310 is set to allow even flow of the cap material over the voids 320, and allow for some wicking or capillary action to backfill a portion of the voids 320 when defining the porous structures. For example, the additional layer 510 in FIG. 5A includes portions of the dielectric material that have entered the voids 320a-f (e.g., compared to the voids 320a-f in FIG. 3C).

Figure 5A:
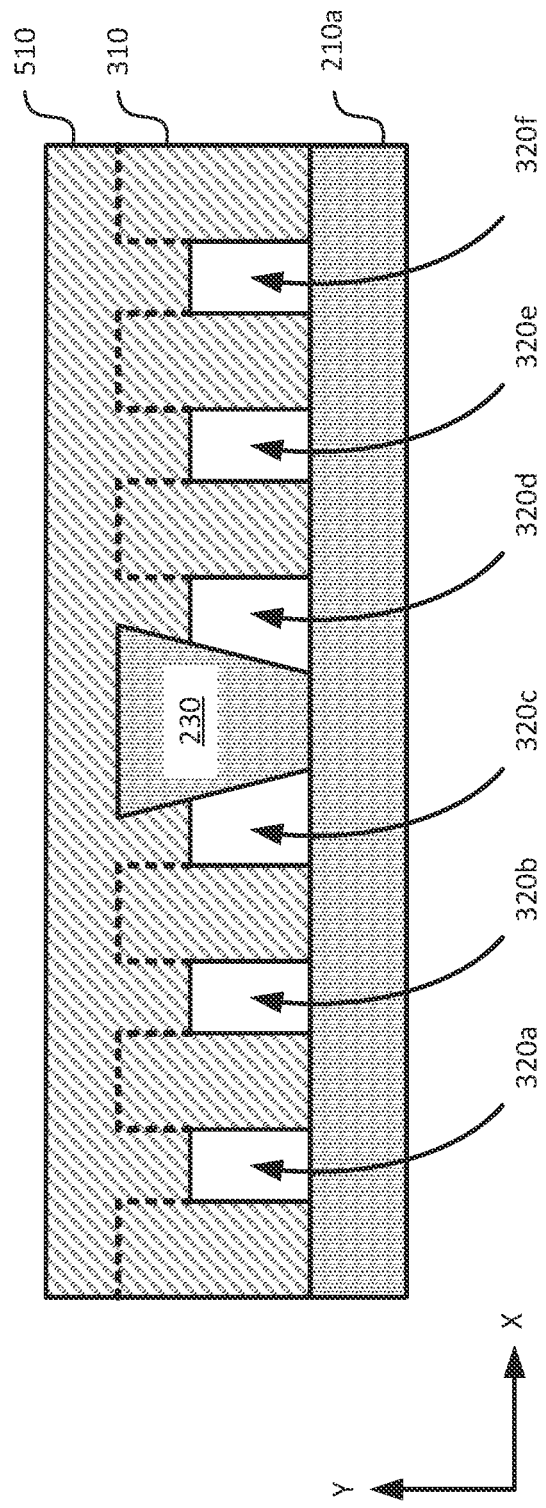
FIGS. 5A-5C illustrate example design layouts of a mushroom cell PCM device using an additional dielectric layer to define porous structures in an induced porous dielectric material, according to embodiments of the present disclosure.
Figure 5B:
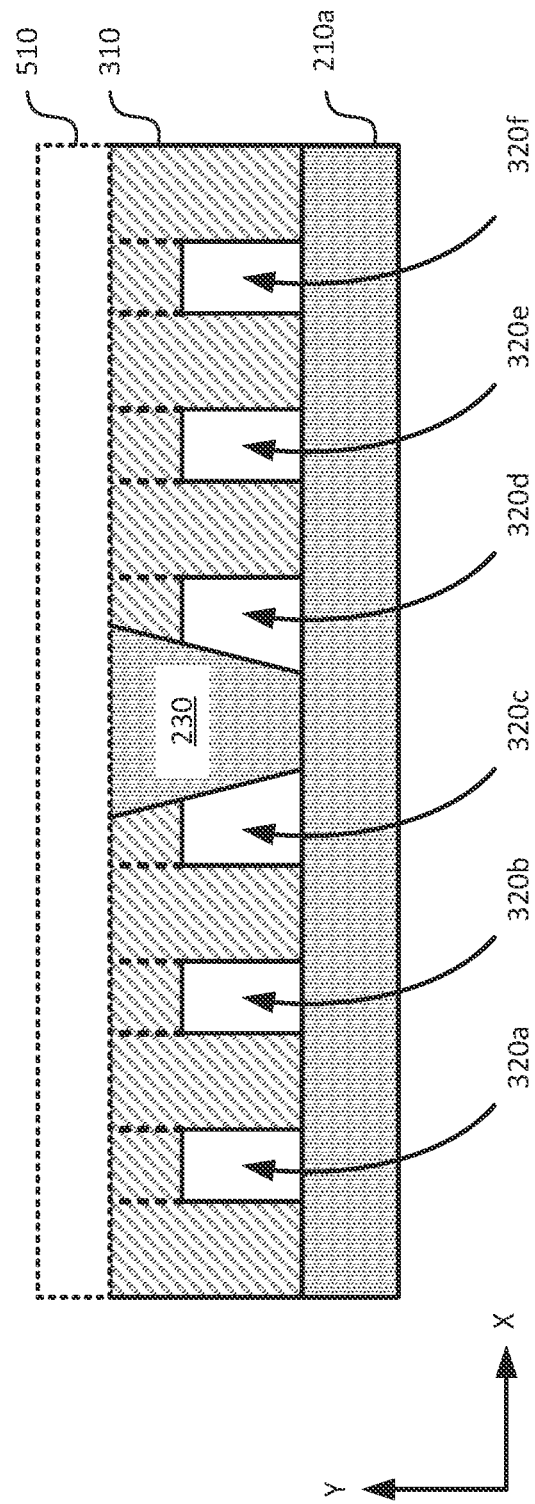

At block 160 the fabricator optionally planarizes the surface of the cap. For example, in FIG. 5B, the fabricator removes a portion 520 of the additional layer 510 added per block 150 to ca the voids 320 (e.g., as shown in FIG. 5A) to thereby expose a surface of the heater electrode 230. In various embodiments, the fabricator uses physical etching processes, chemical etching processes, or combinations thereof to expose the top of the heater electrode 230 and produce an even surface for the additional layer 510 aligned with the top of the heater electrode 230.

At block 170 the fabricator deposits the phase change material(s) and the second electrode 210b to finalize the PCM device. In various embodiments, the phase change material can include Germanium Antimony Telluride (GeSbTe or GST), Germanium Telluride (GeTe), Antimony Telluride (SbTe), or various other phase change materials with different resistive properties associated with different solid states.

Figure 2C:
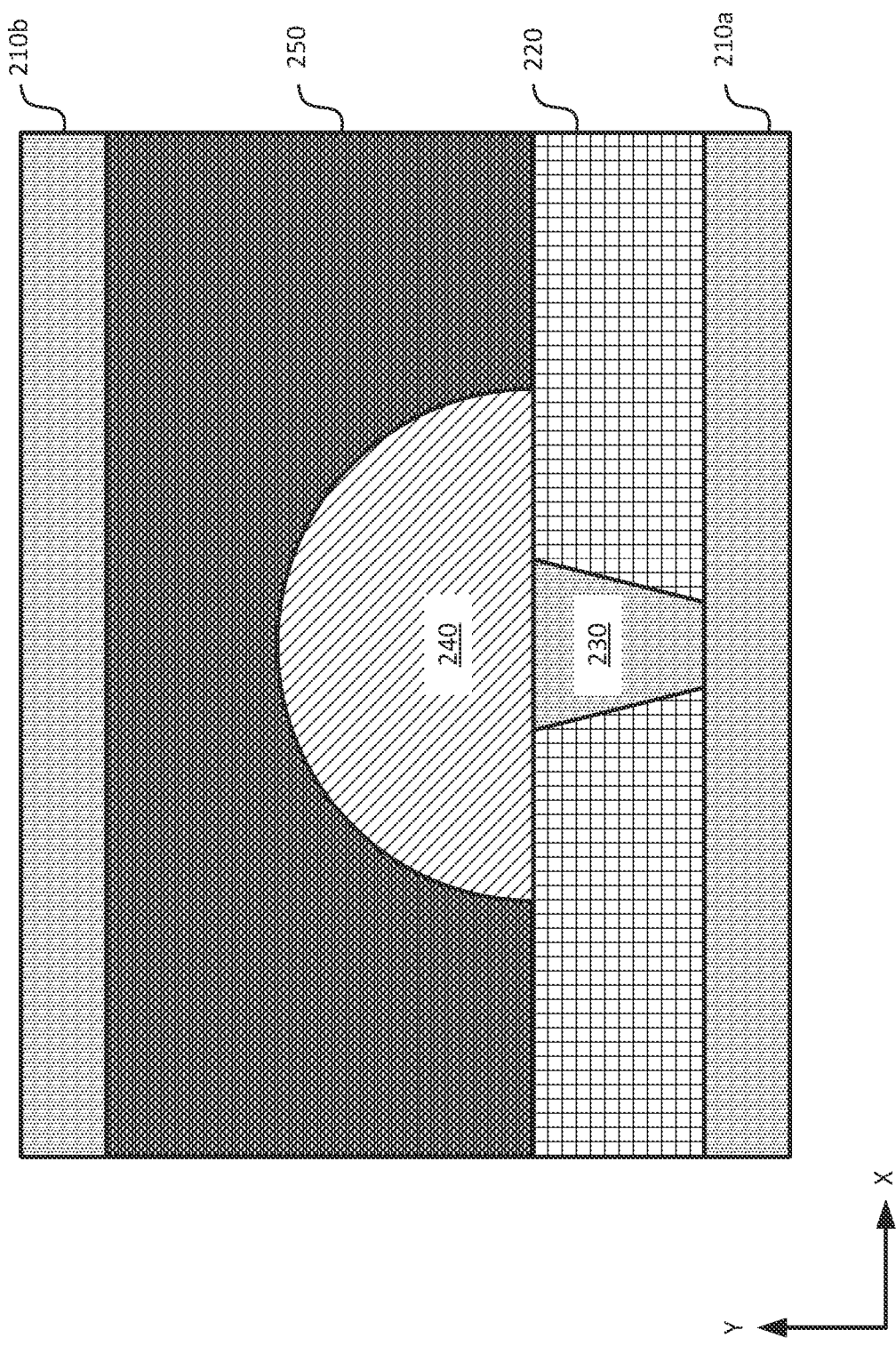
Figure 5C:
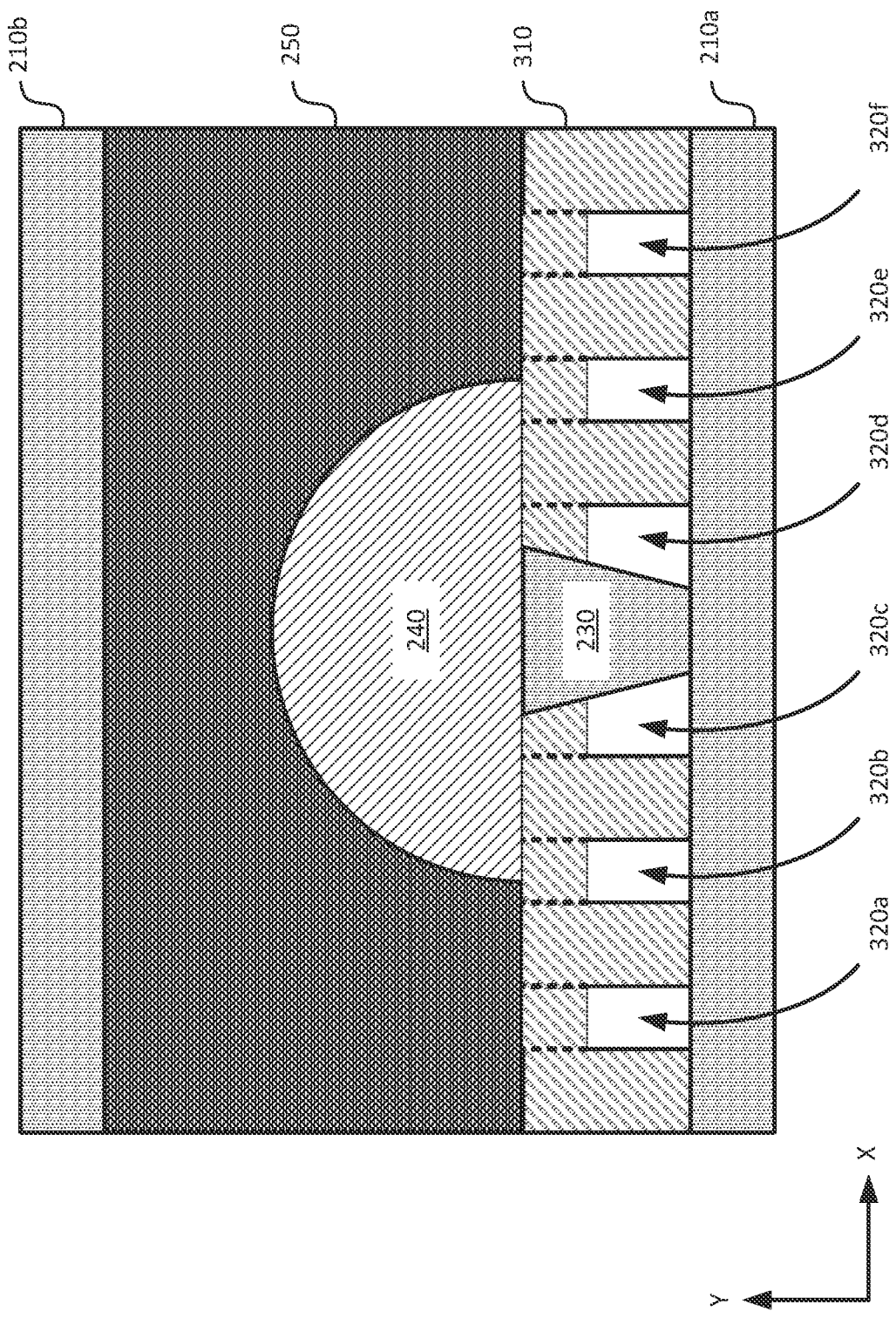

In FIGS. 2C, 4B, and 5C, the phase change material is shown with two states: a first state 240 (e.g., an amorphous state) and a second state 250 (e.g., a crystalline state). As will be appreciated, depending on the relative currents applied to the phase change material(s) and the time allowed for those materials to cool, the relative sizes and amounts of the different states 240/250 may vary, and thus the resistance exhibited by the phase change material between the second electrode 210b and the first electrode 210a may differ to store different logical values in memory. Generally, when the phase change material is in the amorphous state, the shape of the region in the amorphous state is roughly hemispherical, centered around the heater electrode 230. Accordingly, the relative shapes of the heater electrode 230 and the region including the phase change material in the amorphous state describe a "mushroom" shape. By better confining the heat induced by a reset current between the first and second electrodes 230a-b, the porous dielectric provides greater regularity to the hemisphere shape of the amorphous state material, and thus greater predictability in the resistance of the phase change material.

With reference now to FIGS. 6-10, a method of fabrication and example design layouts therefor are presented for a "bridge" cell PCM device that uses porous dielectrics to concentrate heat from the reset current to the phase change material.

Figure 6:
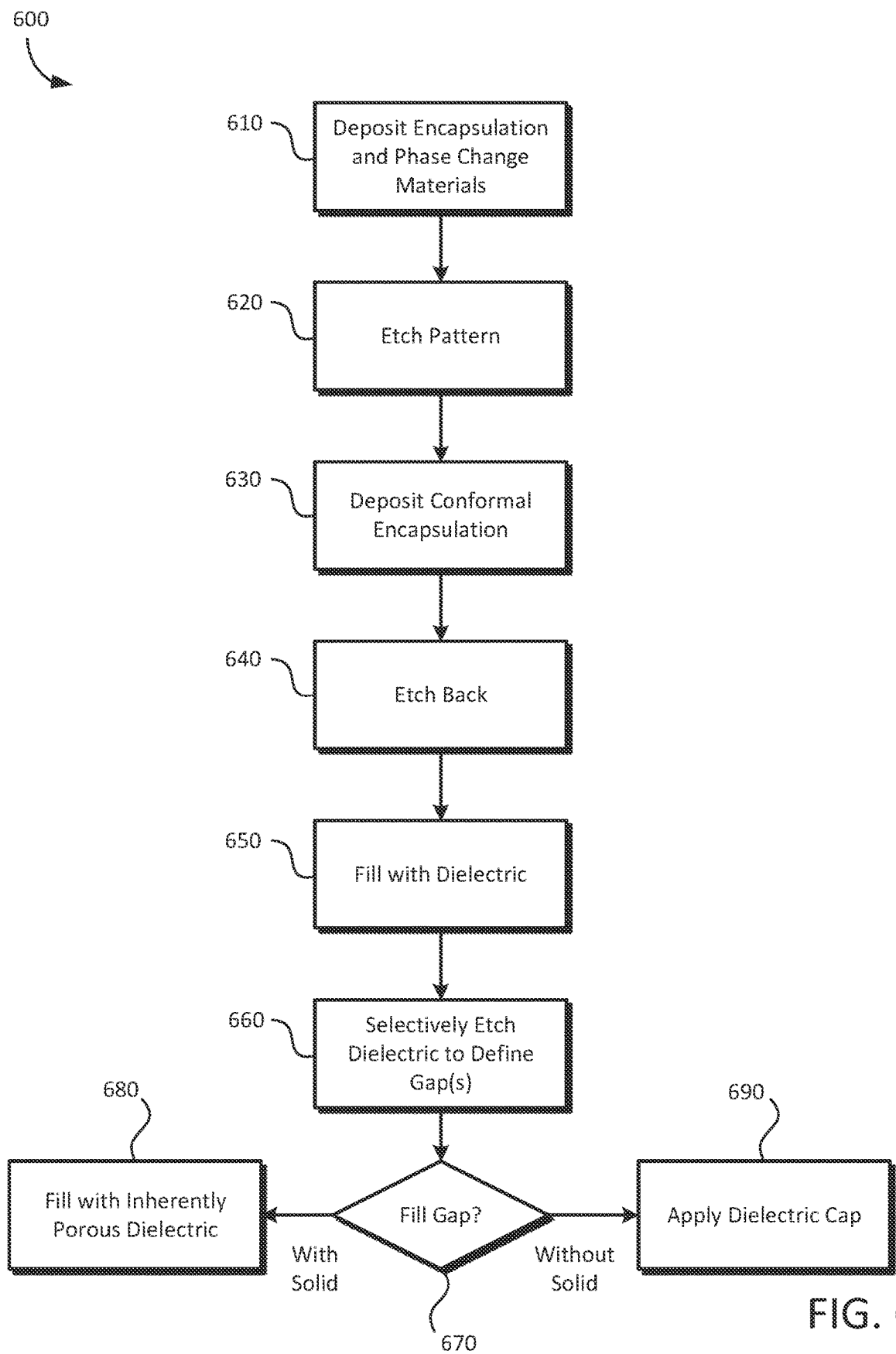
FIG. 6 is a flowchart of a method for fabricating a bridge cell PCM device, according to embodiments of the present disclosure.

FIG. 6 is a flowchart of a method 600 for fabricating a bridge cell PCM device, according to embodiments of the present disclosure. Method 600 may be understood with reference to FIGS. 7A-9D, which illustrate example PCM devices during fabrication, according to embodiments of the present disclosure. FIGS. 7A-7J illustrate cross-sectional views of the PCM device in YX planes while FIGS. 8A-8H illustrate corresponding top-down views of the PCM device from a ZX plane. FIGS. 8A-8H include callouts to identify which of FIGS. 7A-7J correspond to the individual cross-sectional views shown.

Figure 7A:
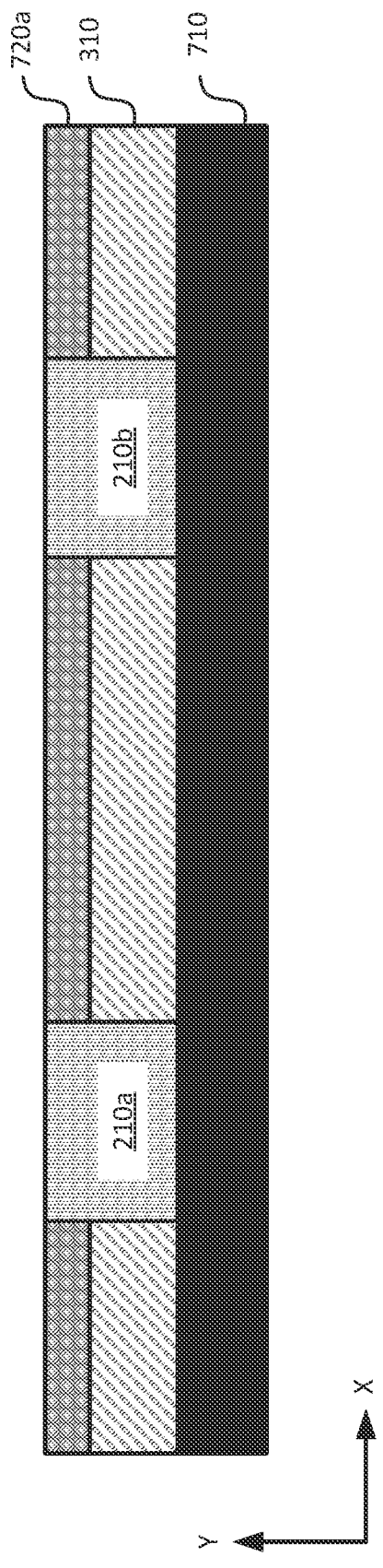
Figure 7B:
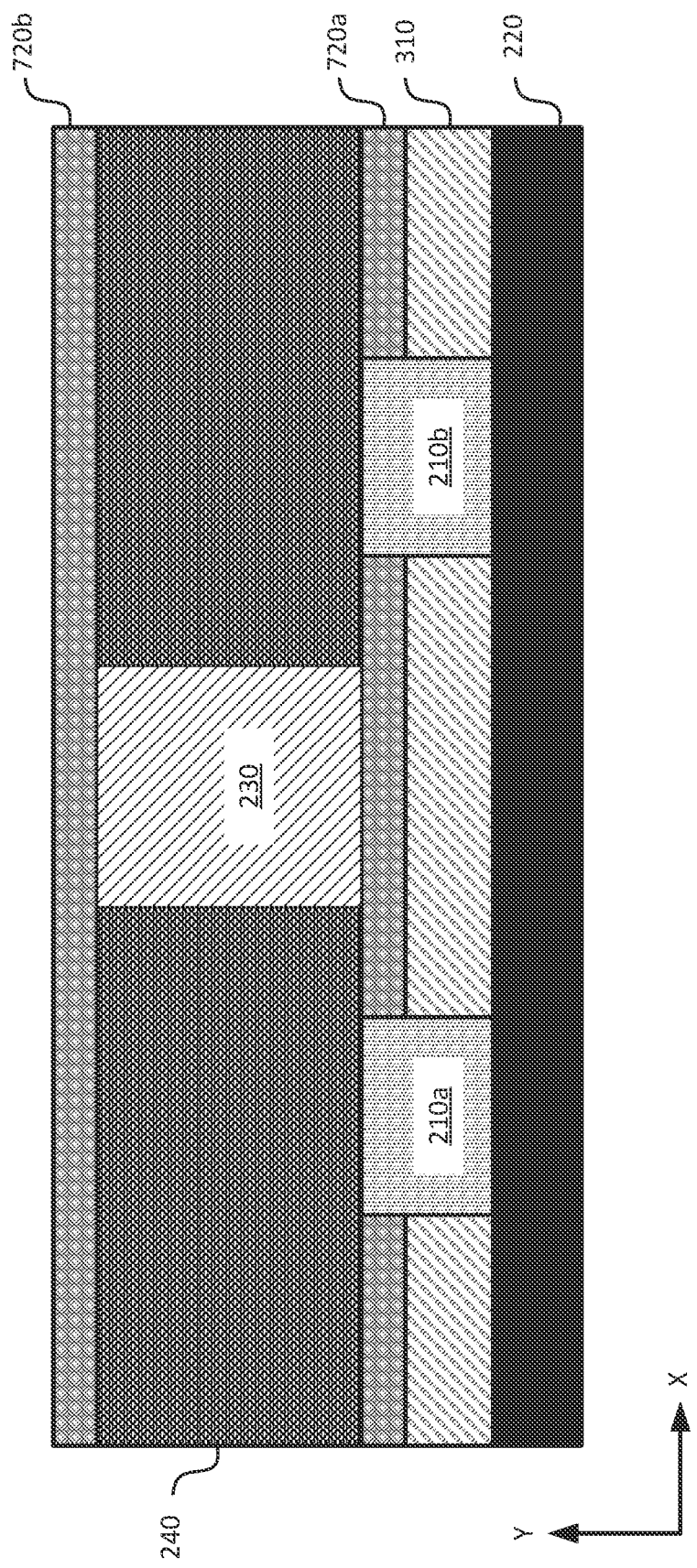
Figure 8A:
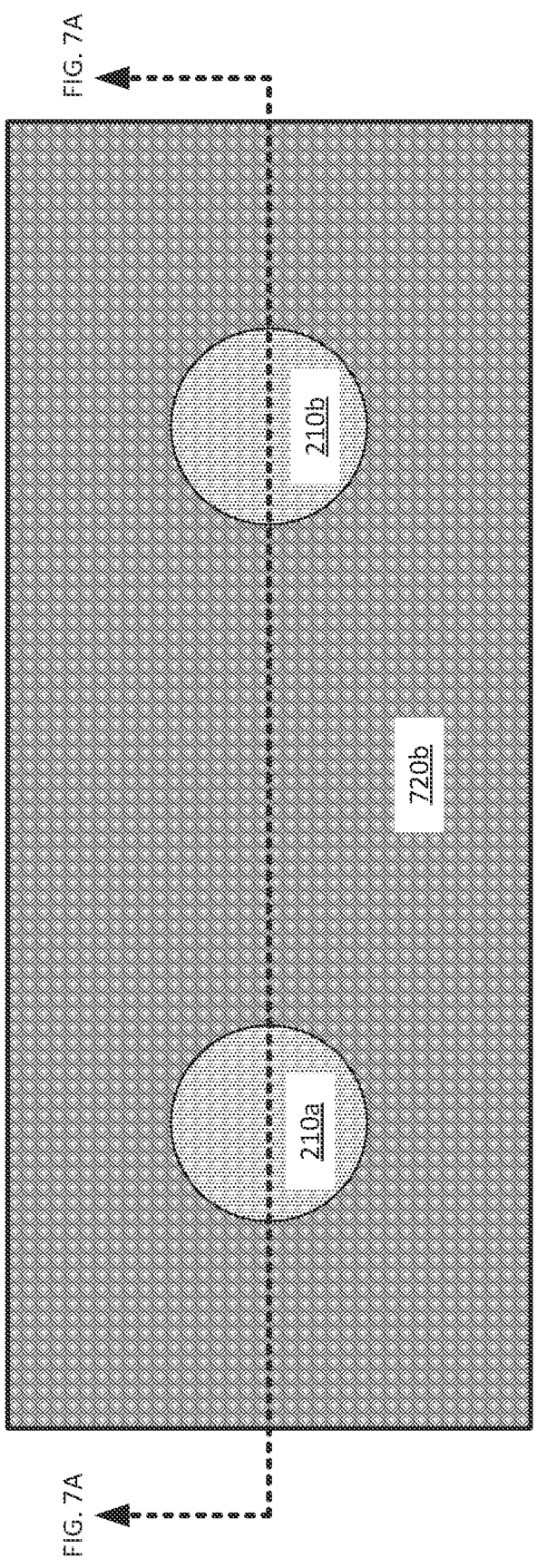

Method 600 begins at block 610, starting with a base component that includes a dielectric 310 formed on a substrate 710 that includes a first electrode 210a and a second electrode 210b as is shown in FIGS. 7A and 8A. At block 610 a fabricator deposits a first layer of encapsulation material 720a (generally or collectively encapsulation or encapsulation material 720) on the dielectric 310 and the electrodes 210a-b. The fabricator deposits a layer of phase change material on the first layer of encapsulation material 720a, and a second layer of encapsulation material 720b on the phase change material, resulting in the layout shown in FIGS. 7B and 8B.

In various embodiments, the encapsulation material 720 can include Silicon Nitride (SiN), Tantalum Nitride (TaN), or other materials with higher melting points than the phase change material. Accordingly, the encapsulation material 720 may be the same material as the dielectric 310 in some embodiments (e.g., both SiN). The phase change material may include various materials that exhibit different resistances when in different solid states (e.g., amorphous solid versus crystalline solid) including GST, GeTe, and SbTe. Although shown and discussed in relation to FIGS. 7A-8H with one region in a first state 240 and two regions of a second state 250, the phase change material may be deposited in one state and may operate with different portions of the phase change material in either state 240/250 from what is illustrated. Stated differently, each of the two states 240/250 are shown to illustrate a non-limiting example of operations of the phase change material once the PCM device is finalized.

Figure 7C:
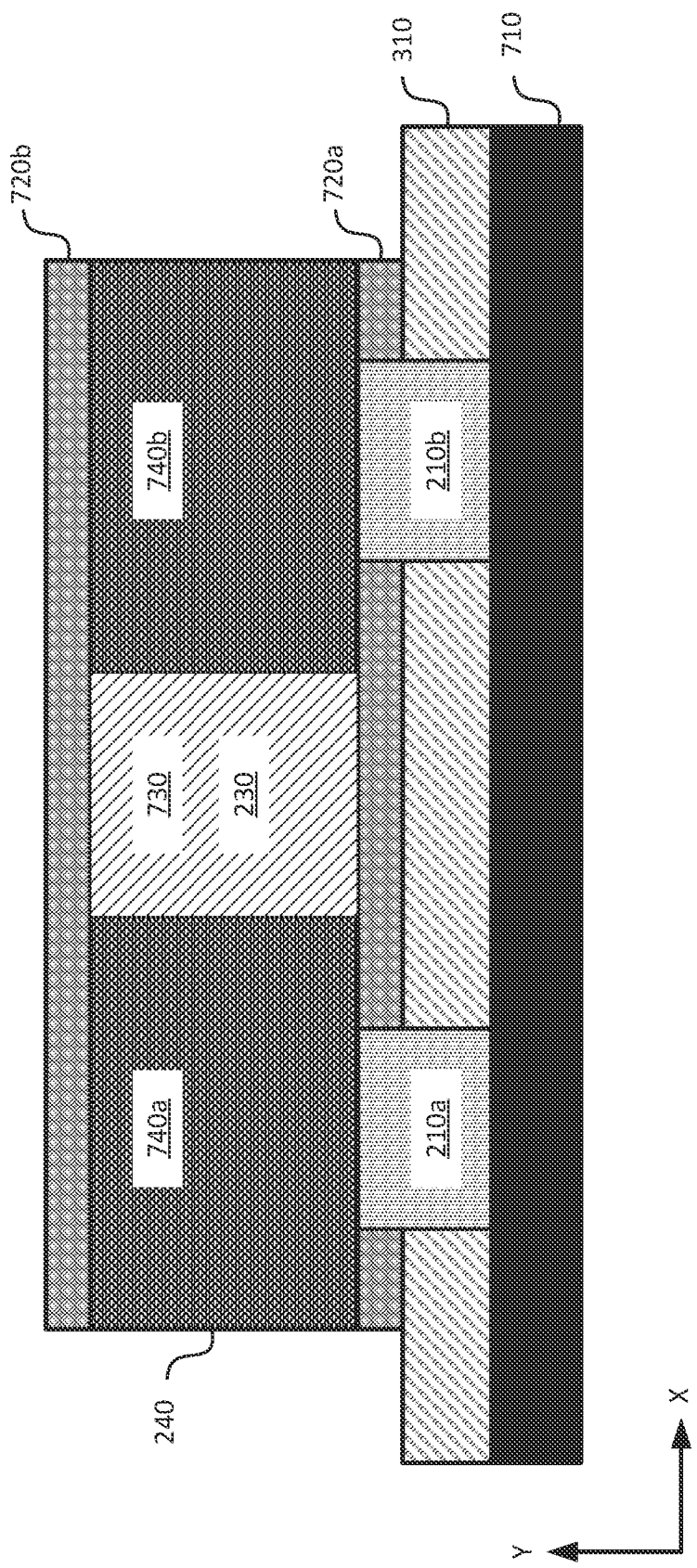
Figure 7D:
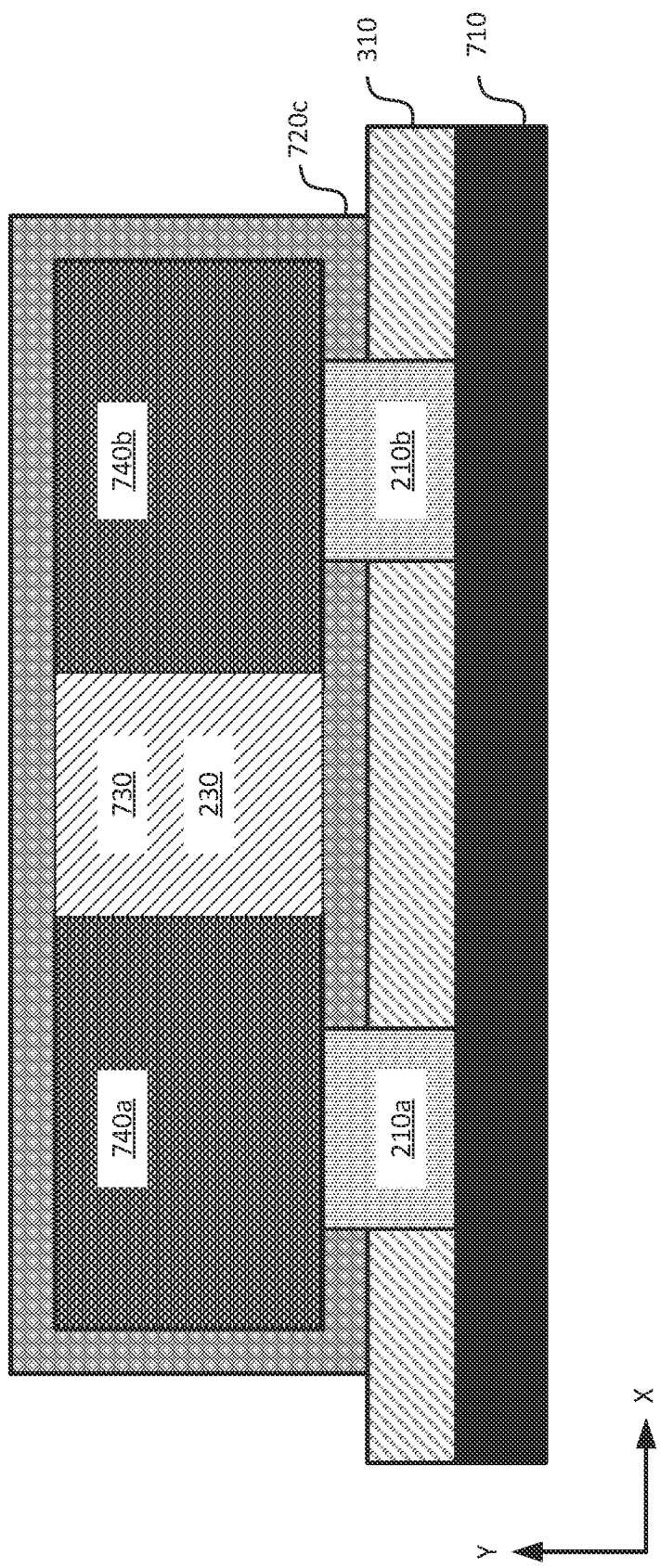
Figure 8B:
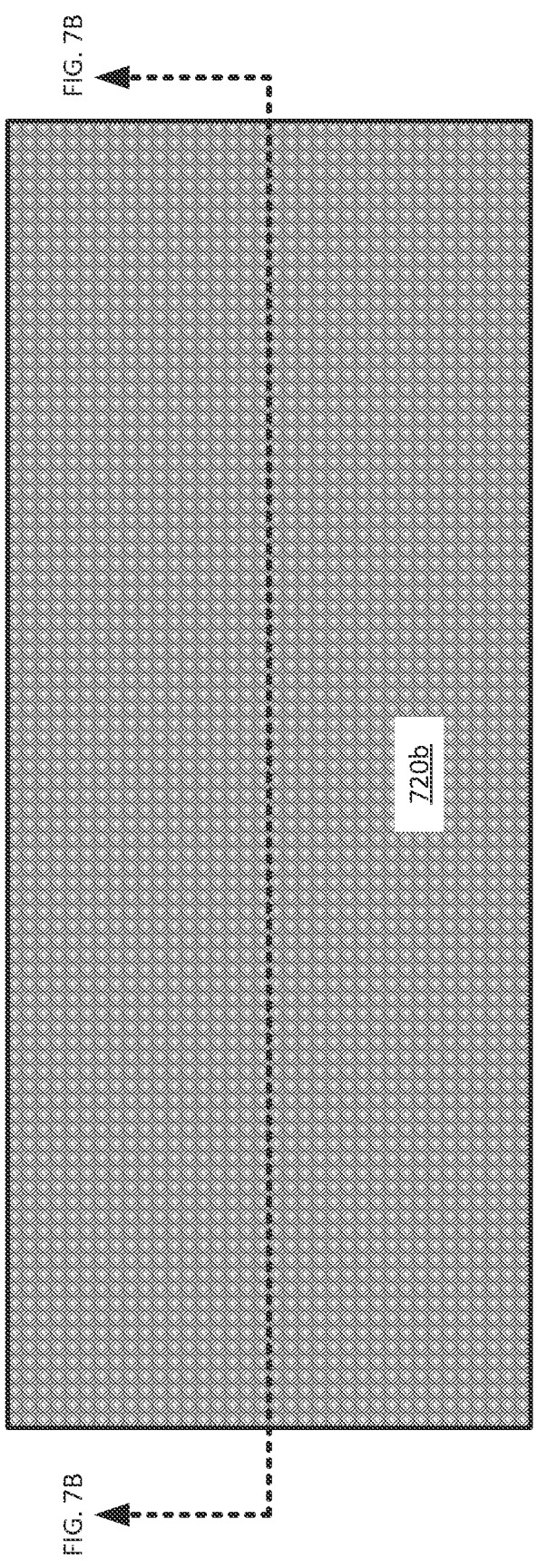
Figure 8D:
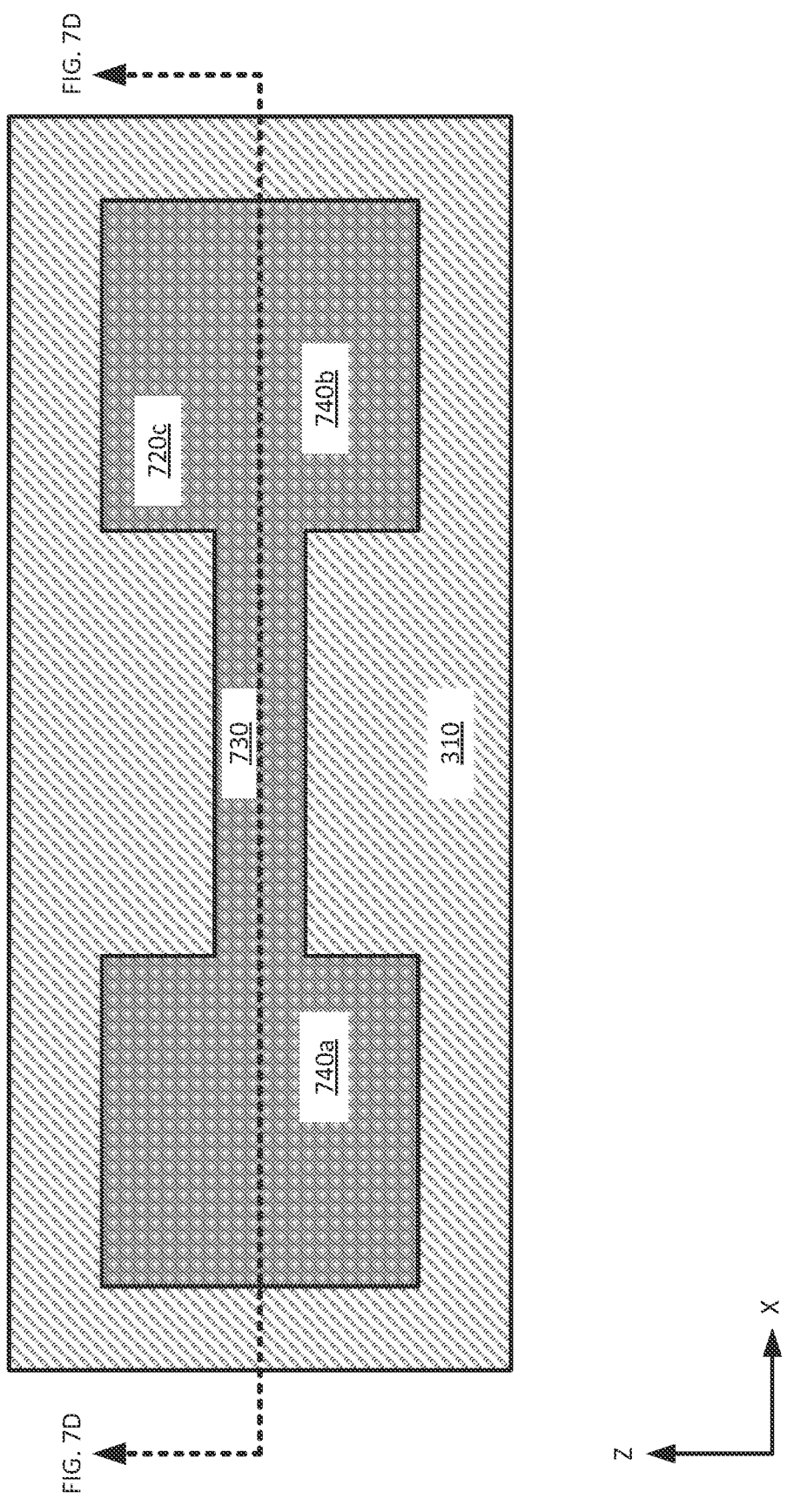

At block 620 the fabricator etches a pattern to define the bridge shape in the encapsulation material 720a-b and the phase change material. As shown in FIGS. 7C and 8B, the phase change material and encapsulation material 720 are generally deposited in sheets or layers of variable thickness in the Y direction and even coverage in the X and Z directions. To produce the desired "bridge" shape in the PCM device, the fabricator applies various physical and chemical etching processes to selectively remove some of the phase change material and the encapsulation material 720. As shown in FIGS. 7C and 8C, the etching process exposes some of the dielectric 310 and shapes the remaining phase change material and encapsulation material 720 into three regions.

The three regions include a first connected region 740a (generally or collectively connected region 740) that is electrically connected to the first electrode 210a, a second connected region 740b that is electrically connected to the second electrode 210b, and a bridging region 730 that electrically connects the first connected region 740a to the second connected region 740b. In various embodiments, the connected regions 740 include a greater volume of material than the bridging region 730, which is thinned out in the Z direction compared to the connected regions 740. Accordingly, the bridging region has a higher surface area to volume ratio than either the first connected region 740a or the second connected region 740b.

At block 630 the fabricator deposits a conformal layer of encapsulation material 720c around the bridge-patterned phase change material and encapsulation material 720a-b. Because the encapsulation material 720 is generally deposited in sheets or layers of variable thickness in the Y direction and even coverage in the X and Z directions, the conformal layer of encapsulation material 720c evenly coats the exposed surfaces shown in FIGS. 7C and 8C. To restore the bridge pattern to the PCM device, method 600 proceeds to block 640 where the fabricator etches back the conformal layer of encapsulation material 720c result in the layouts shown in FIGS. 7D and 8D. The encapsulation material 720c now encapsulates the phase change material in the desired shape within the PCM device.

Figure 7E:
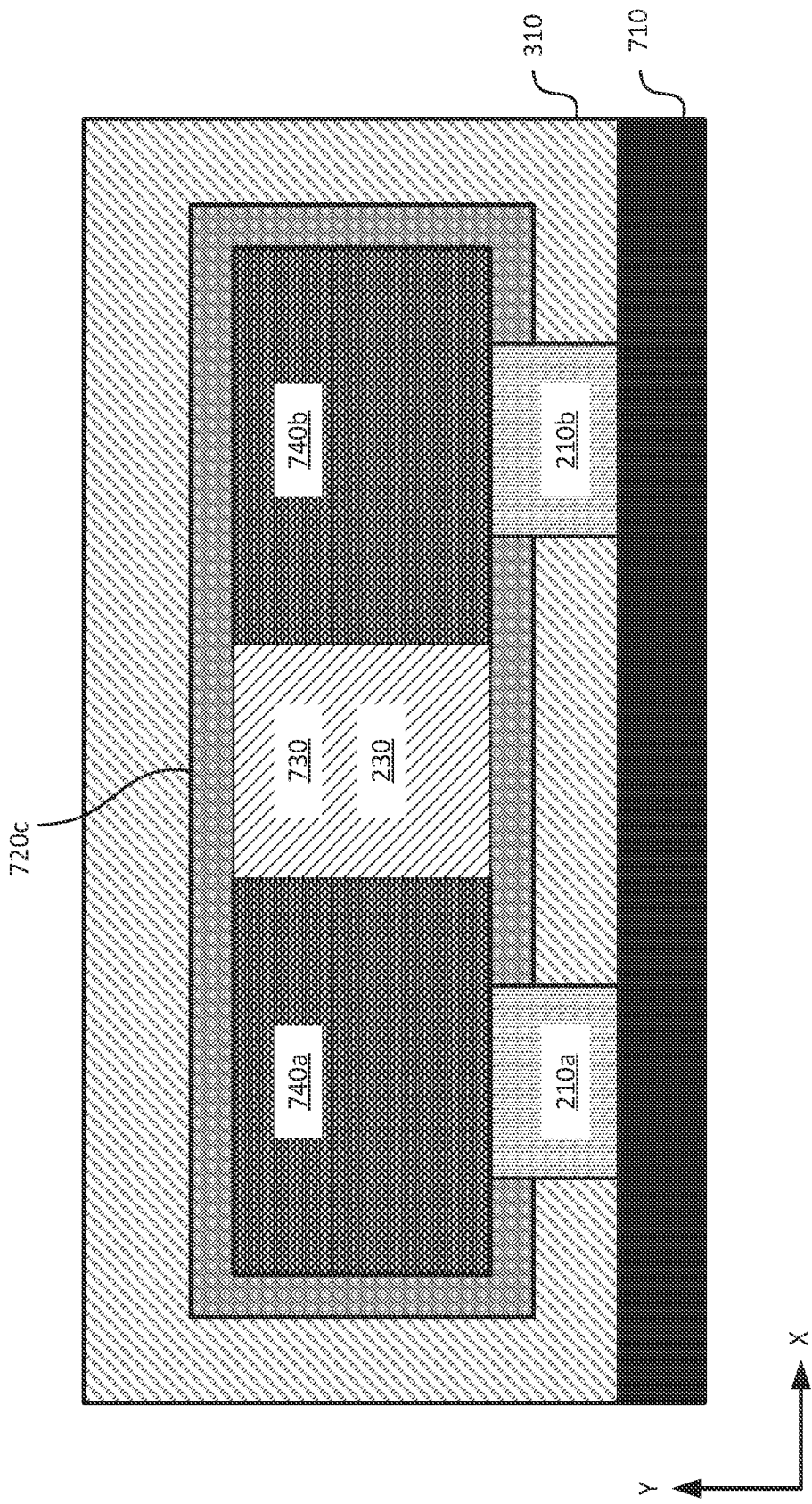
Figure 8E:
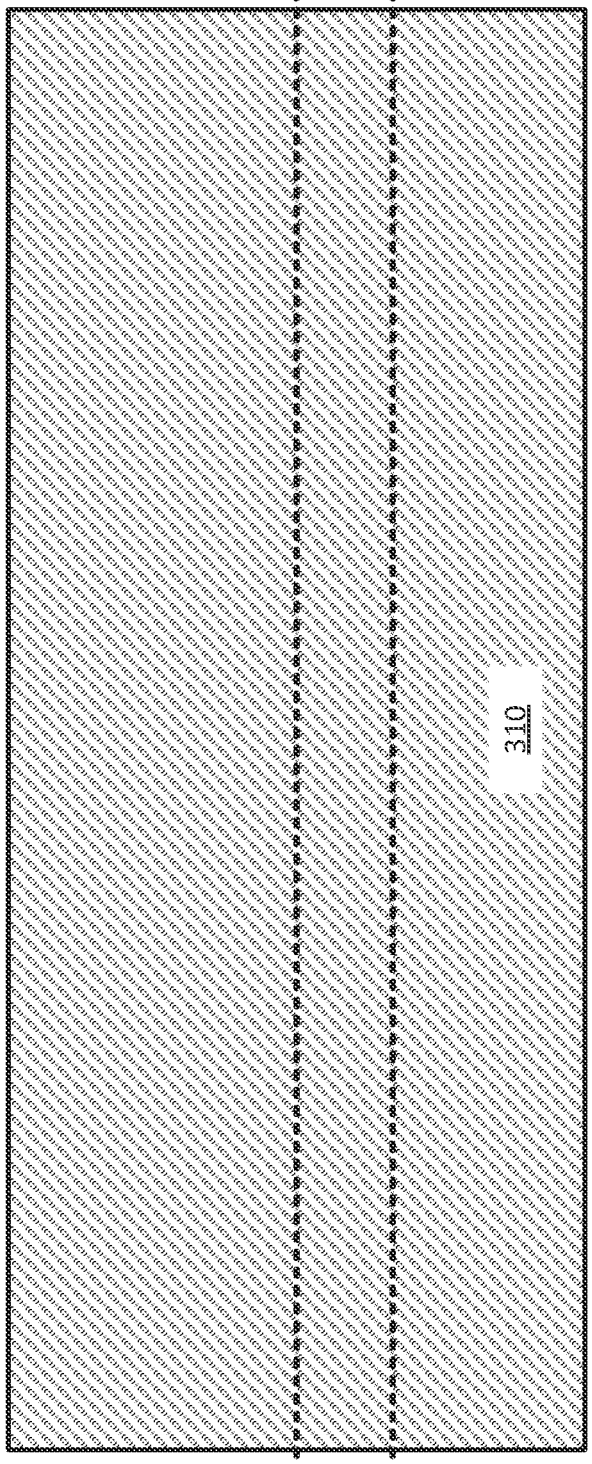

At block 650 the fabricator fills the cell for the PCM device with a dielectric 310 resulting in the layout shown in FIGS. 7E and 8E. Although shown as the same dielectric material on which the first encapsulation material 720a was deposited (per block 610), in various embodiments, the dielectric material may be different from one another. In various embodiments, the dielectric 310 includes one or more of SiN, SiO$_2$, SiCOH, or another dielectric material.

FIG. 7I illustrates a different cross-sectional view of the layout of the PCM device shown in FIG. 8E from that shown in FIG. 7E (e.g., in a parallel YX plane to the cross-sectional view of FIG. 7E). FIGS. 7E and 7I illustrate that when the PCM device is shaped according to a bridge pattern that the first connected region 740a is separated from the second connected region 740b by respective layers of the encapsulation material 720 and intervening dielectric 310 expect for the areas connected by the bridging region 730.

Figure 7F:
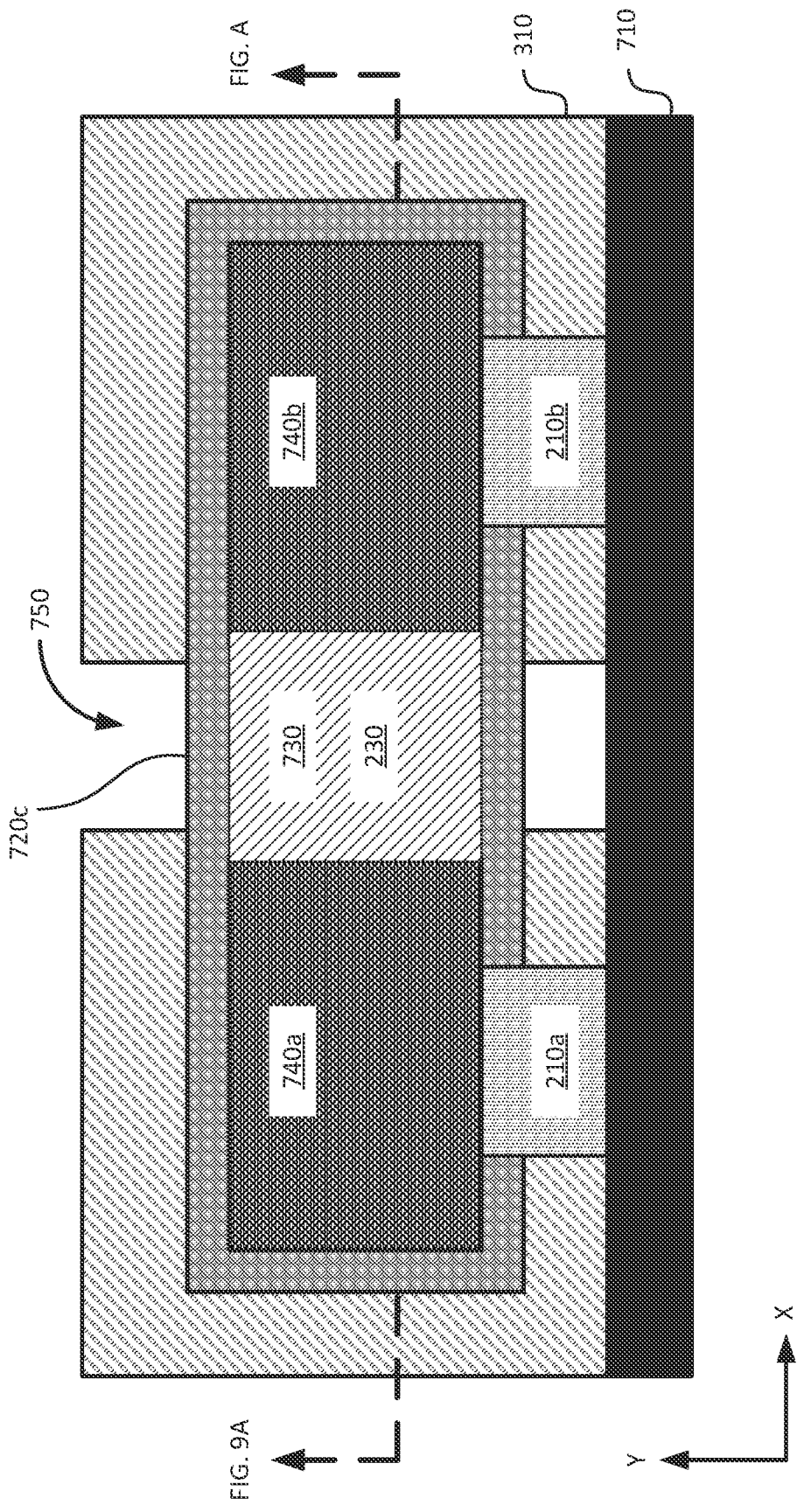

At block 660 the fabricator selectively etches the dielectric 310 to define one or more gaps 750 in areas of the bridged-patterned PCM device to concentrate heat by insulating those areas from the surroundings (e.g., the dielectric 310). As used herein, when referring to a gap 750 being defined "around" a region or object, it shall be understood that the gap 750 exposes that region or object on at least two sides or faces. For example, as shown in FIG. 7F, the gap 750 is defined both above and below the bridging region 730 in the Y direction, and as shown in FIG. 8F, the gap 750 is defined both above and below the bridging region 730 in the Z direction. Accordingly, the gap 750 may be said to be formed around the bridging region 730.

Figure 7G:
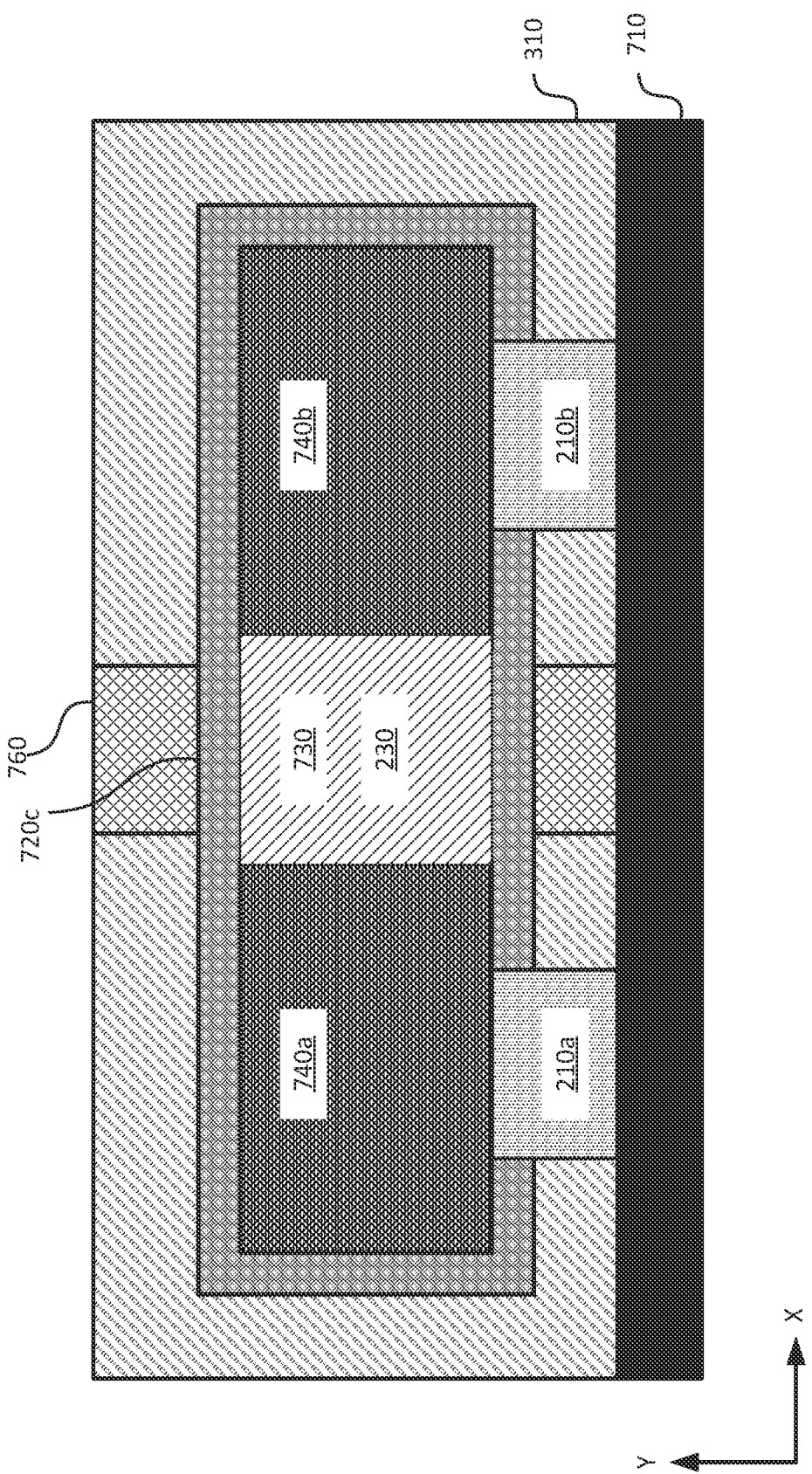
Figure 7H:
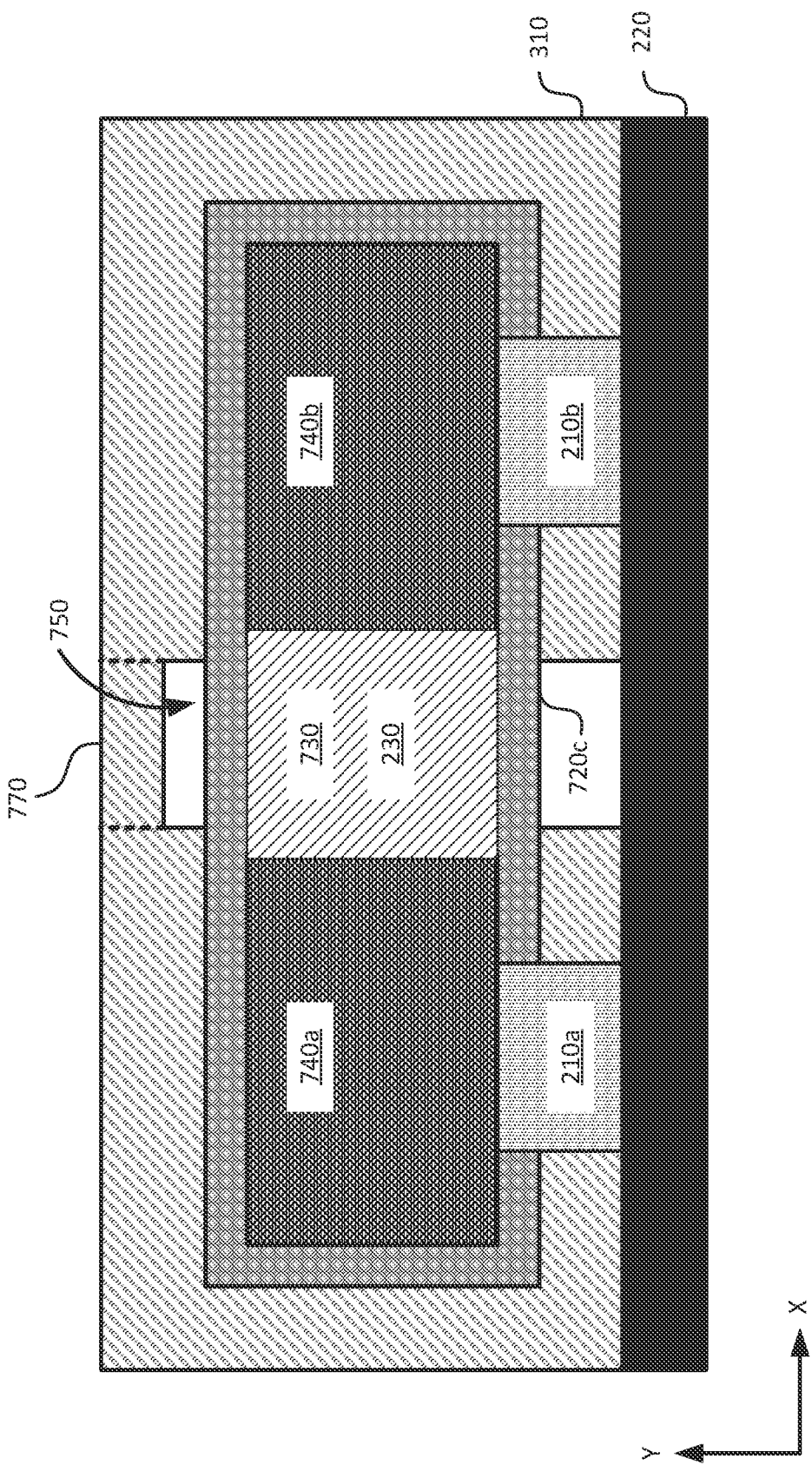
Figure 71:
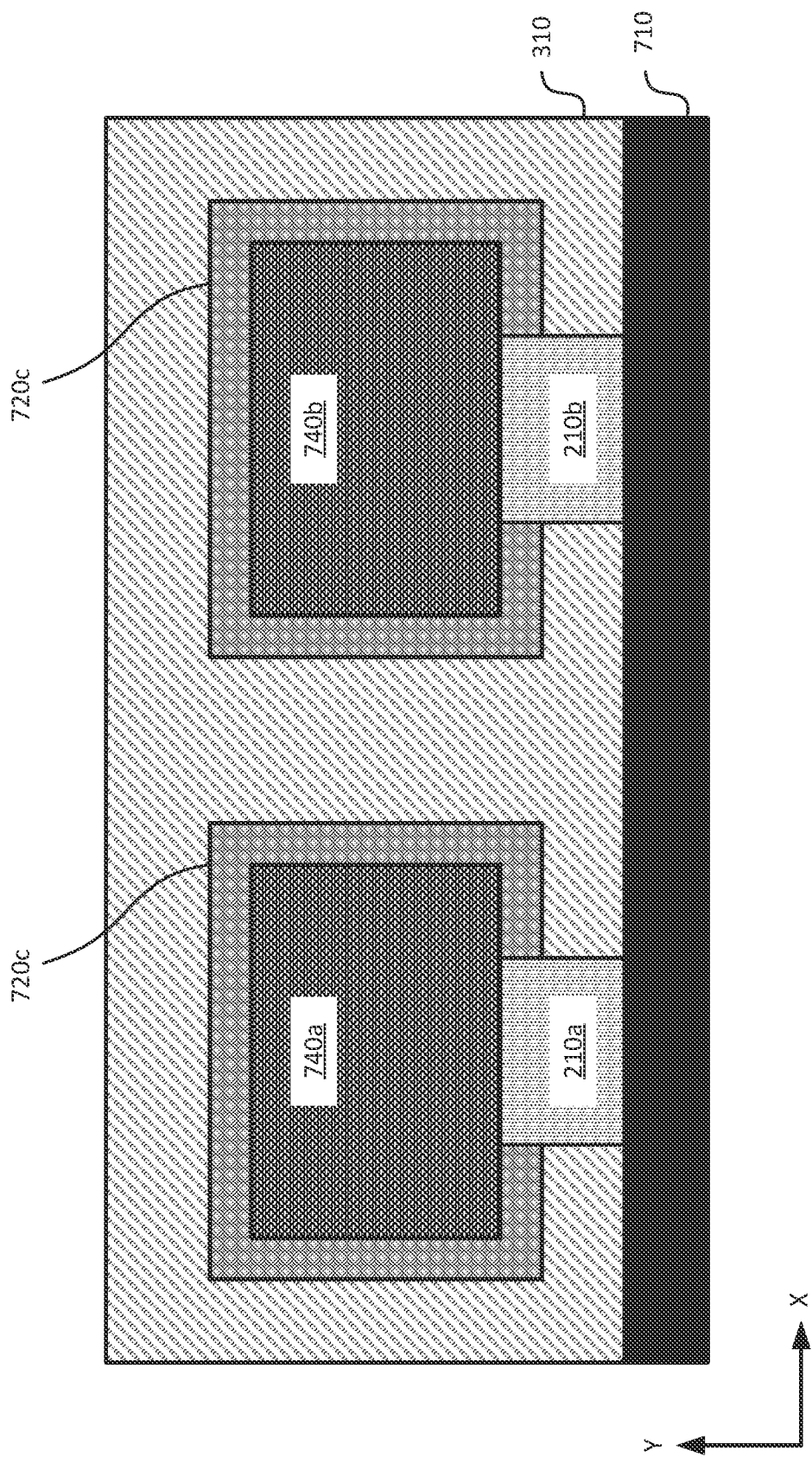
Figure 7J:
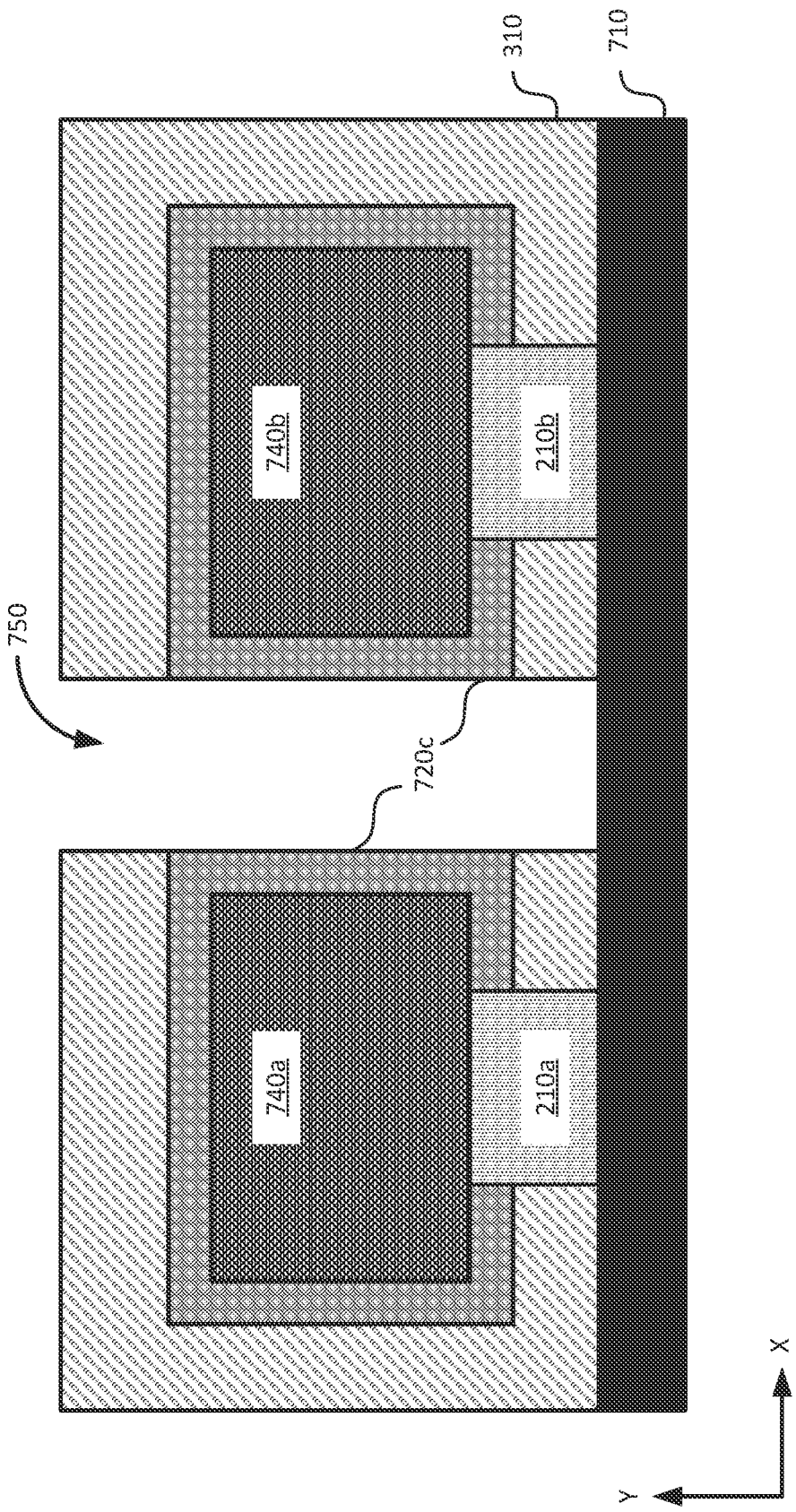

FIG. 7J illustrates a different cross-sectional view of the layout of the PCM device shown in FIG. 8F from that shown in FIG. 7F (e.g., in a parallel YX plane to the cross-sectional view of FIG. 7F). FIGS. 7F and 7J illustrate that when a gap 750 is formed around the bridging region 730, the gap 750 may extend outward from the bridging region 730 (e.g., in the Z direction). In various embodiments, the size, shape, and relative location of the gap 750 may differ from that illustrated in the Figures. A fabricator can define the size, shape, and location of the gap 750 (and the number of gaps 750 to define) according to the design needs of the PCM device, the insulating materials used, etc.

Figure 9A:
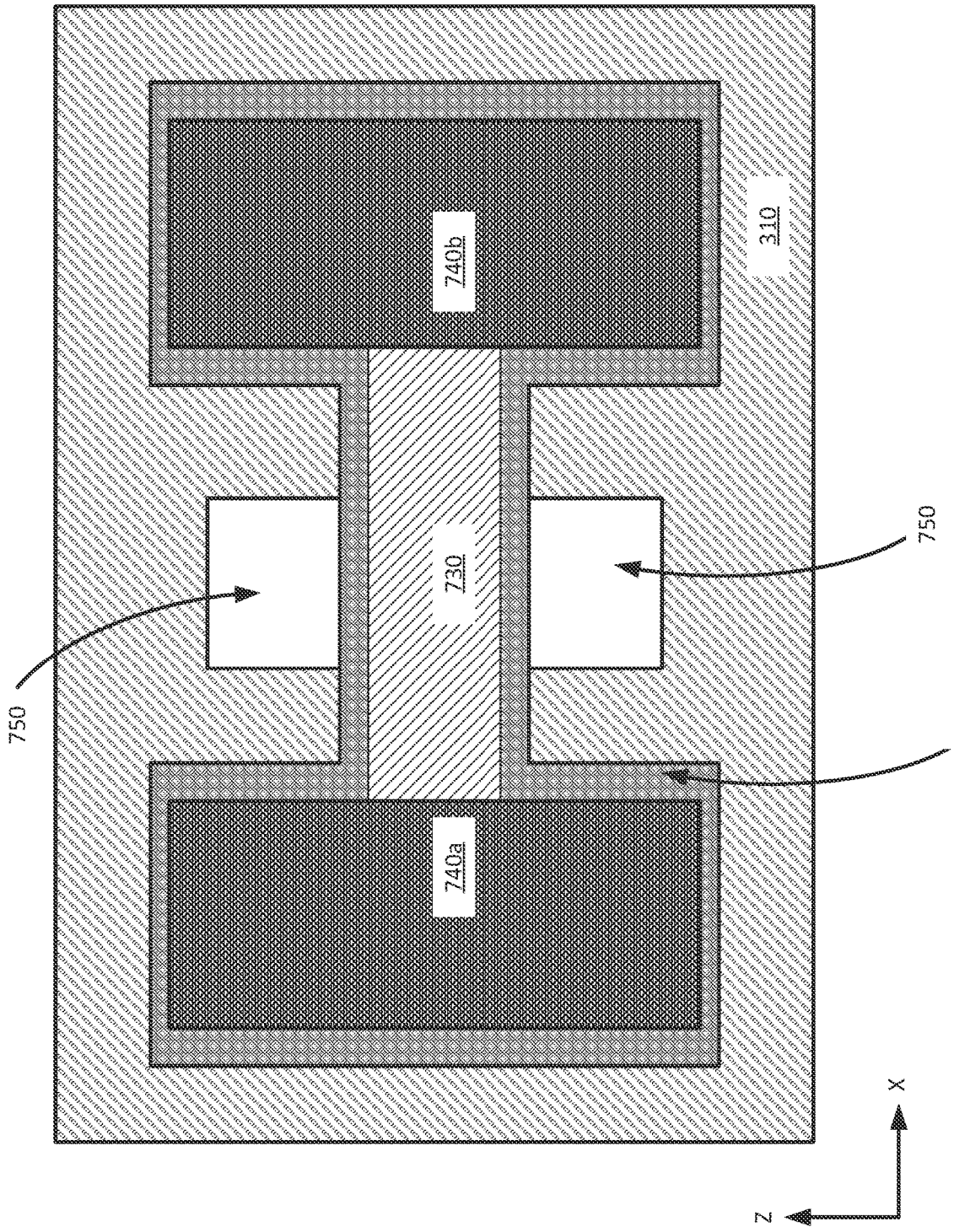
FIGS. 9A-9D illustrate details of a gaps defined in a dielectric of a bridge cell PCM device, according to embodiments of the present disclosure.
Figure 9B:
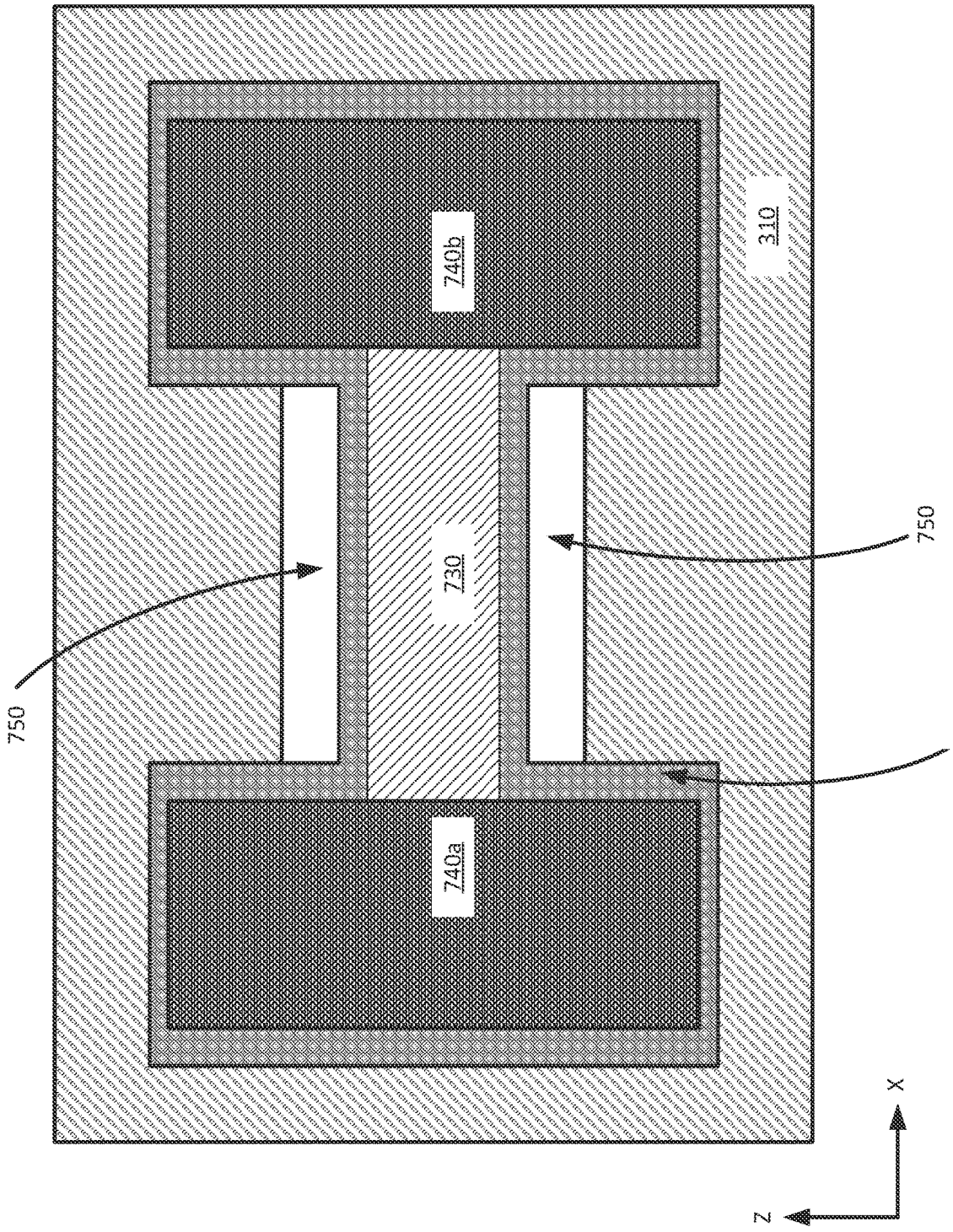
Figure 9C:
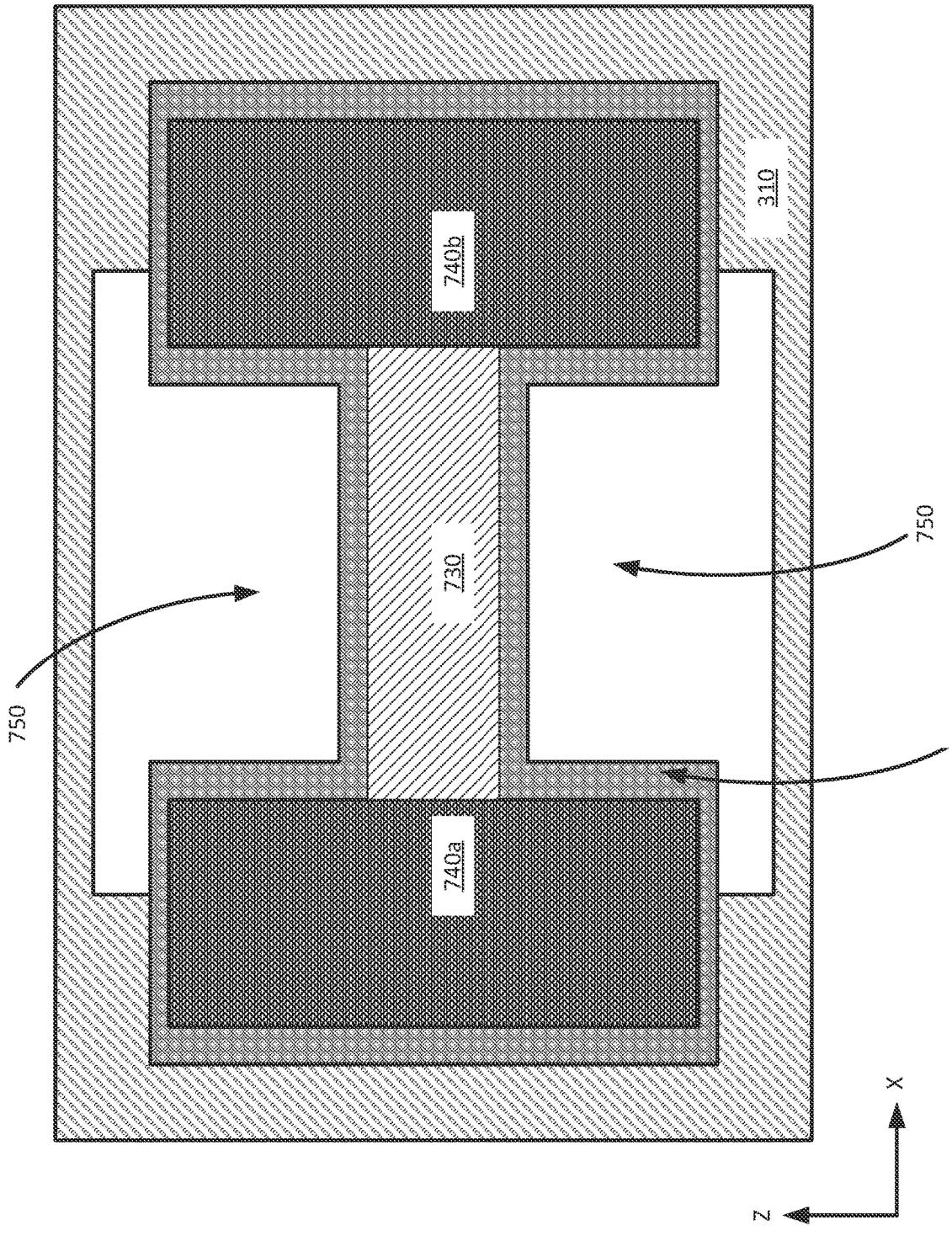

FIGS. 9A-9D illustrate various sizes, shapes, locations, and quantities of gaps 750, as may be used defined in a dielectric of a bridge cell PCM device, according to embodiments of the present disclosure. FIG. 9A corresponds to a detailed cross-sectional view of the gap 950 shown in FIG. 7F, while FIGS. 9B and 9C illustrate larger gaps 750. Depending on the size and orientation of the gap 750, the resulting thermal insulator can be localized to a specific portion of the bridging region 730 (e.g., as in FIG. 9A), include all of the bridging region 730 (e.g., as in FIG. 9B), or extend to provide insulation around the connected regions 740 (e.g., as in FIG. 9C).

In various embodiments, the differently size gaps 750 shown in FIGS. 9A-9C may be used instead of one another or in addition to one another to provide gaps 750 with variable dimensions in the ZX plane at different locations on the Y axis.

Figure 9D:
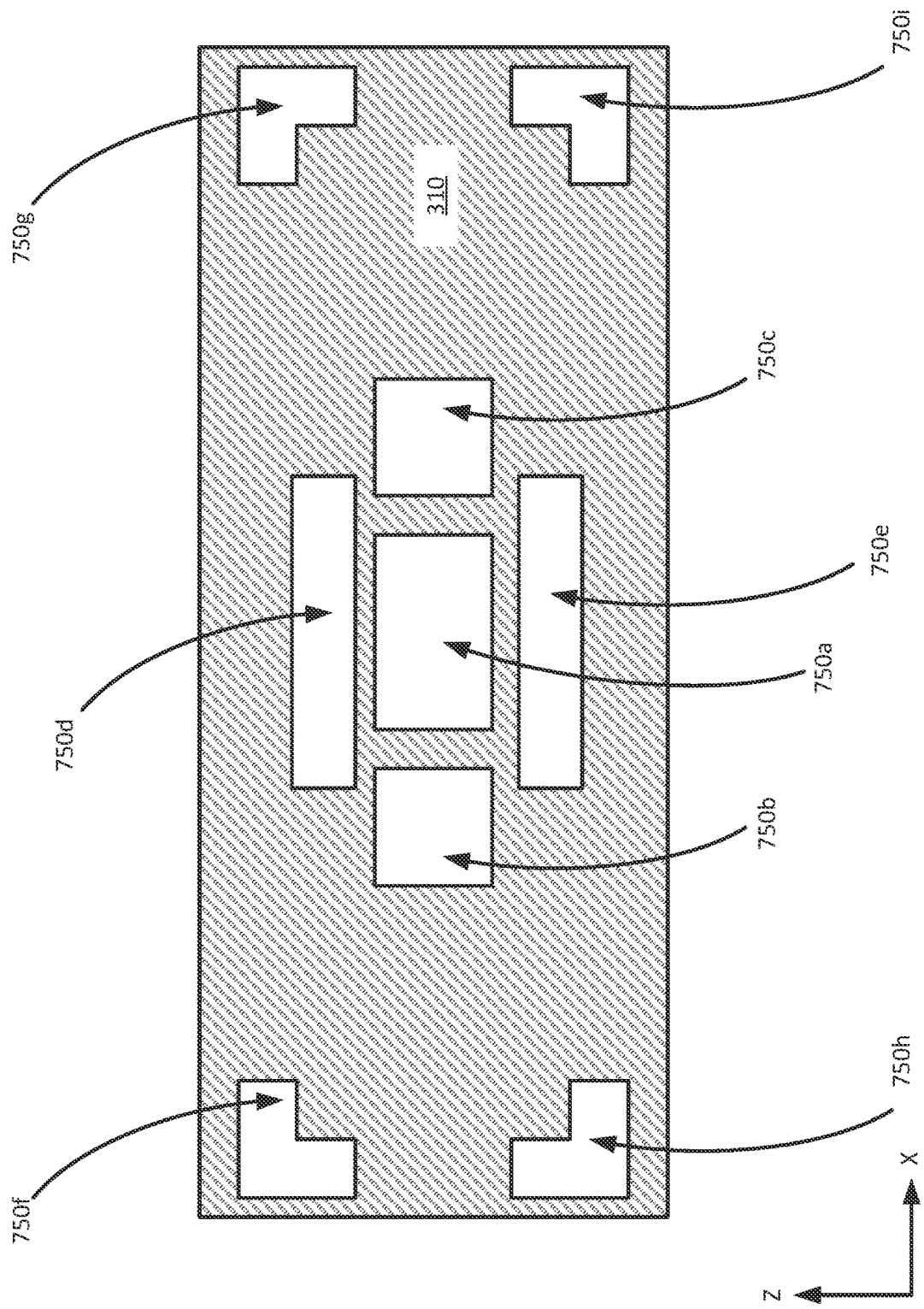

FIG. 9D illustrates a plurality of gaps 750a-i that may be used in addition to or instead of a singular gap 750, such as is illustrated in FIGS. 9A-9C. A fabricator may define various gaps 750 at various locations in the dielectric 760 and underlying materials to define additional porous structures in different regions of the PCM device. For example, a first gap 750a may be defined around the bridging region 730 at a central portion (in the X direction) of the bridging region 730, while a second gap 750b and a third gap 750c are defined at the ends of the bridging region 730 (e.g., nearer to the connected regions 740).

Additionally or alternatively to the first gap 750a, the fabricator may form one or more of a fourth gap 750d and a fifth gap 750e more distally to the bridging region 730 (in the Z direction) than the first gap 750a. In various embodiments, the fourth gap 750d or fifth gap 750e provide supplemental thermal insulation to the thermal insulation provided by the first gap 750a. In some embodiments, the first gap 750a is omitted, and the fourth gap 750d and fifth gap 750e are defined around the bridging region 730 and the intervening dielectric 310 (e.g., left in place to provide physical support for the bridging region 730) to provide thermal insulation for the bridging region 730.

Additionally or alternatively to gaps 750 provided relative to the bridging region 730, the fabricator may define gaps around the connected regions 740, such as gaps 750f-i, which are located around the connected regions 740 (at the corners of the connected regions 740).

Returning to method 600 of FIG. 6, after the fabricator forms the gap(s) 750 per block 660, the fabricator determines at block 670 how to fill the gap(s) 750 to insulate the elements of the PCM device that the gap(s) 750 is/are defined around. When the fabricator determines to fill a gap 750 with a solid thermal insulator, method 600 proceeds to block 680. When the fabricator determines to fill a gap 750 without a solid thermal insulator, method 600 proceeds to block 690.

Figure 8G:
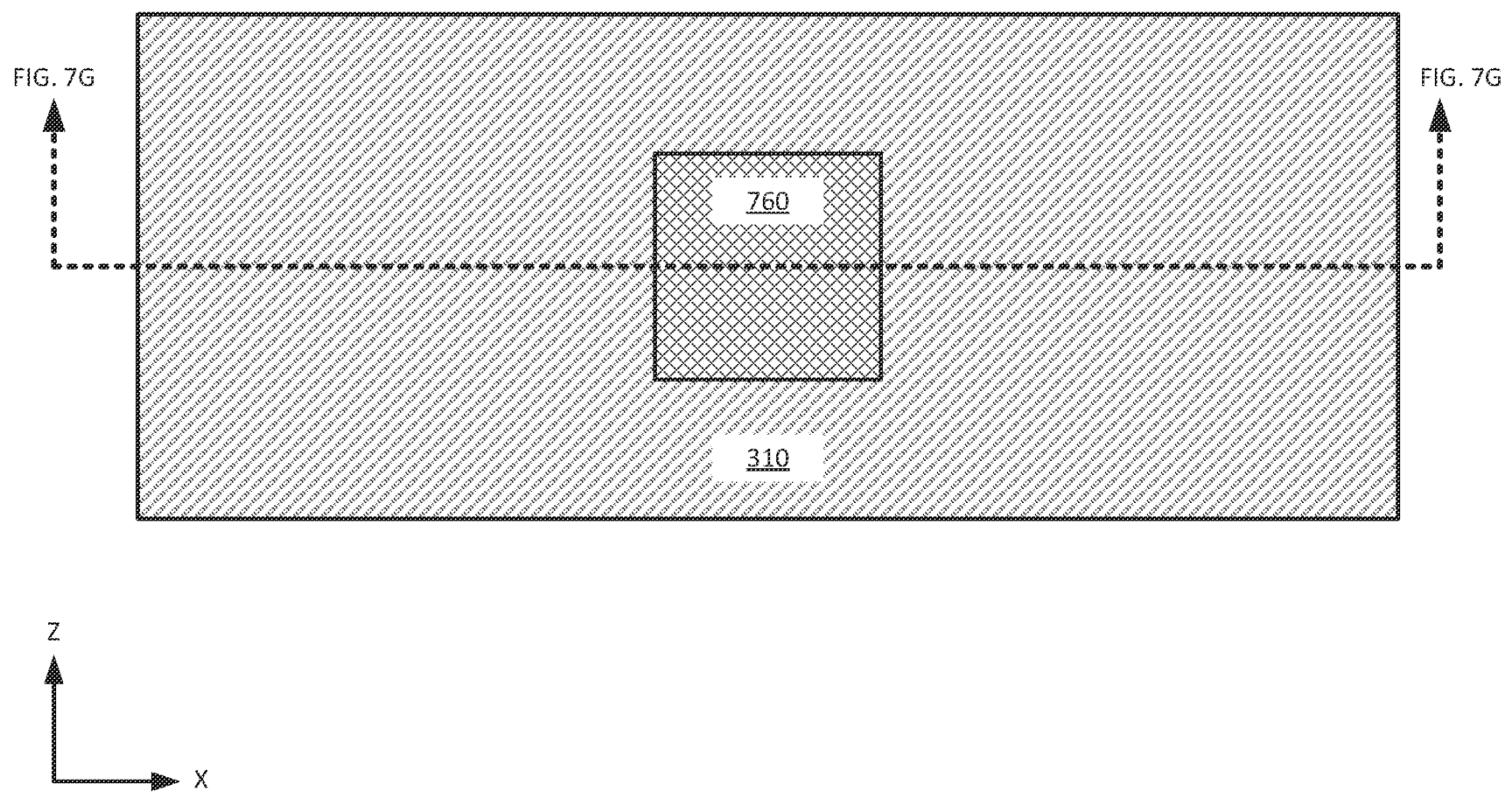

At block 680 the fabricator fills the gap 750 with an inherently porous dielectric 760 as a solid thermal insulator. FIGS. 7G and 8G illustrate an inherently porous dielectric 760 that fills the gap 750 illustrated in FIGS. 7F and 8F. In various embodiments, the fabricator may fill the gap 750 with a solid thermal insulator using a liquid flow process, vapor deposition, epitaxial growth, or physically inserting a pre-formed plug of the thermal insulator. In various embodiments, the inherently porous dielectric 760 may include a SiCOH material that inherently includes porous structures that capture the atmosphere present during fabrication; creating pockets of air included in the solid structure to insulate the element that the gap 750 was formed around and the inherently porous dielectric 760 now surrounds.

At block 690 the fabricator applies a dielectric cap 770 to the gap 750 to define a porous structure in the dielectric 310. FIGS. 7H and 8H illustrate a cap 770 applied to seal the gap 750 illustrated in FIGS. 7F and 8F. Once applied, the cap 770 seals the gap 750, trapping the atmosphere present during fabrication within the gap 750 to act as a thermal insulator. In various embodiments, the atmosphere may include ambient air at ambient pressure or a predefined gas at a predefined pressure (including vacuum).

Although illustrated as being made from the same material as the dielectric 310, in various embodiments, the cap 700 may be made from different materials, and may extend into or above the gap 750 for various distances. In some embodiments, the fabricator applies the cap 770 as an additional layer of material applied to the upper surface of the dielectric 310 in the PCM device (which may be etched down to a desired height). In some embodiments, the fabricator applies a pre-formed cap 770 of a desired size and shape to seal the gap 750 with an epoxy or other sealant.

Method 600 may conclude after block 680 or block 690.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A Phase Change Memory (PCM) device, comprising:
   a first electrode;
   a second electrode;
   a porous dielectric layer disposed on the first electrode, wherein a plurality of voids extend through the porous dielectric layer to expose corresponding sections of the first electrode;
   a heater electrode disposed within the porous dielectric layer and electrically connected to the first electrode; and
   a phase change material, disposed between the porous dielectric layer and the second electrode, and electrically connected to the heater electrode.

2. The PCM device of claim 1, wherein the porous dielectric layer is made of an inherently porous dielectric material.

3. The PCM device of claim 1, further comprising a conductive projection liner disposed between the porous dielectric layer and the phase change material, wherein the conductive projection liner seals the plurality of voids.

4. The PCM device of claim 1, further comprising an additional layer of dielectric material applied over the plurality of voids.

5. The PCM device of claim 1, wherein the plurality of voids define concentric channels centered on the heater electrode.

6. The PCM device of claim 1, wherein the phase change material is configured to exhibit a first resistance when in a first solid state and exhibit a second resistance different from the first resistance when in a second solid state different from the first solid state.

7. A Phase Change Memory (PCM) device, comprising:
   a first electrode;
   a second electrode; and
   a phase change material comprising:
      a first connected region electrically connected to the first electrode and having a first surface-area-to-volume ratio (SA:V);
      a second connected region electrically connected to the second electrode and having a second SA:V;
      a bridging region electrically connecting the first connected region to the second connected region, wherein the bridging region has a third SA:V that is greater than the first SA:V and greater than the second SA:V; and
      a porous dielectric disposed around the bridging region.

8. The PCM device of claim 7, wherein the porous dielectric is made of an inherently porous dielectric material.

9. The PCM device of claim 7, wherein the porous dielectric is made of an induced porous dielectric material, wherein a void is defined in the porous dielectric around the bridging region and a dielectric cap is formed to seal the void and define a porous structure.

10. The PCM device of claim 9, further comprising a conformal encapsulation material disposed around the phase change material.

11. The PCM device of claim 9, further comprising a second porous dielectric defined around a second region of the phase change material.

12. The PCM device of claim 9, wherein the phase change material is configured to exhibit a first resistance when in a first solid state and exhibit a second resistance different from the first resistance when in a second solid state different from the first solid state.

13. The PCM device of claim 7, further comprising:
   a layer of encapsulation material, the first electrode and the second electrode extending therethrough and defining a common top surface with the layer of encapsulation material,
   wherein the first connected region, the second connected region, and the bridging region are disposed on the common top surface,
   wherein the bridging region extends along a first dimension between the first connected region and the second connected region, and
   wherein a width of the bridging region, along a second dimension perpendicular to the first dimension, is less than a width of the first connected region and less than a width of the second connected region.

14. A Phase Change Memory (PCM) device, comprising:
   a first electrode;
   a second electrode;
   a phase change material disposed in an electrical path between the first electrode and the second electrode; and
   a porous dielectric layer disposed on the first electrode, wherein a plurality of voids extend through the porous dielectric layer to expose corresponding sections of the first electrode, the porous dielectric layer configured to concentrate heat produced by a reset current carried through the phase change material between the first electrode and the second electrode to mitigate an amount of heat that escapes from the phase change material.

15. The PCM device of claim 14, wherein the porous dielectric layer is made of an inherently porous dielectric material.

16. The PCM device of claim 14, wherein the porous dielectric layer is made of an induced porous dielectric material in which a plurality of porous structures are defined.

17. The PCM device of claim 14, further comprising a heater electrode extending from the first electrode and disposed in the porous dielectric layer.

18. The PCM device of claim 14, wherein the phase change material includes:
   a first connected region electrically connected to the first electrode and having a first surface-area-to-volume ratio (SA:V);
   a second connected region electrically connected to the second electrode and having a second SA:V; and
   a bridging region electrically connecting the first connected region to the second connected region, wherein the bridging region has a third SA:V that is greater than the first SA:V and greater than the second SA:V.

19. The PCM device of claim 18, wherein the porous dielectric layer is defined around the bridging region in a gap defined in a surrounding dielectric.

20. The PCM device of claim 18, wherein the porous dielectric layer is an induced porous dielectric in which a gap is defined around the bridging region to contain an atmosphere of a predefined composition and a predefined pressure.

\* \* \* \* \*